(12) United States Patent
Jin et al.

(10) Patent No.: US 6,765,255 B2
(45) Date of Patent: Jul. 20, 2004

(54) SEMICONDUCTOR DEVICE HAVING METAL-INSULATOR-METAL CAPACITOR AND FABRICATION METHOD THEREOF

(75) Inventors: You-Seung Jin, Seoul (KR); Jong-Hyon Ahn, Kyunggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/396,762

(22) Filed: Mar. 25, 2003

(65) Prior Publication Data

US 2003/0183862 A1 Oct. 2, 2003

(30) Foreign Application Priority Data

Mar. 26, 2002 (KR) ............................................ 02-16328

(51) Int. Cl.[7] ............................................ H01L 27/108
(52) U.S. Cl. ...................... 257/301; 257/300; 257/301; 257/302; 257/303; 257/307; 257/306; 438/242; 438/243; 438/386; 438/387; 438/396
(58) Field of Search ................................. 257/300–304, 257/306; 438/242, 243, 386, 387, 396

(56) References Cited

U.S. PATENT DOCUMENTS 5,604,696 A * 2/1997 Takaishi ..................... 365/149
6,362,042 B1 * 3/2002 Hosotani et al. ............ 438/253
6,459,610 B1 * 10/2002 Prall .......................... 365/149
6,461,911 B2 * 10/2002 Ahn et al. .................. 438/253
6,563,158 B1 * 5/2003 Houston et al. ............ 257/296

FOREIGN PATENT DOCUMENTS

KR   2001-68729   7/2001   ......... H01L/27/108

* cited by examiner

*Primary Examiner*—Allan R. Wilson
*Assistant Examiner*—Edgardo Ortiz
(74) *Attorney, Agent, or Firm*—Mills & Onello, LLP

(57) ABSTRACT

A semiconductor device having a capacitor of an MIM structure and a method of forming the same are described. The semiconductor device includes a semiconductor substrate; a first bottom interconnection formed over the semiconductor substrate; an intermetal dielectric layer formed over the semiconductor substrate; a plurality of openings exposing the first bottom interconnection through the intermetal dielectric layer; a bottom electrode conformally formed on the inside wall of the openings, on the exposed surface of the first bottom interconnection and on the intermetal dielectric layer between the openings; a dielectric layer and an upper electrode sequentially stacked on the bottom electrode; and a first upper interconnection disposed on the upper electrode. According to the present invention, an effective surface area per a unit planar area of a capacitor with an MIM structure is enlarged to increase capacitance thereof.

18 Claims, 31 Drawing Sheets

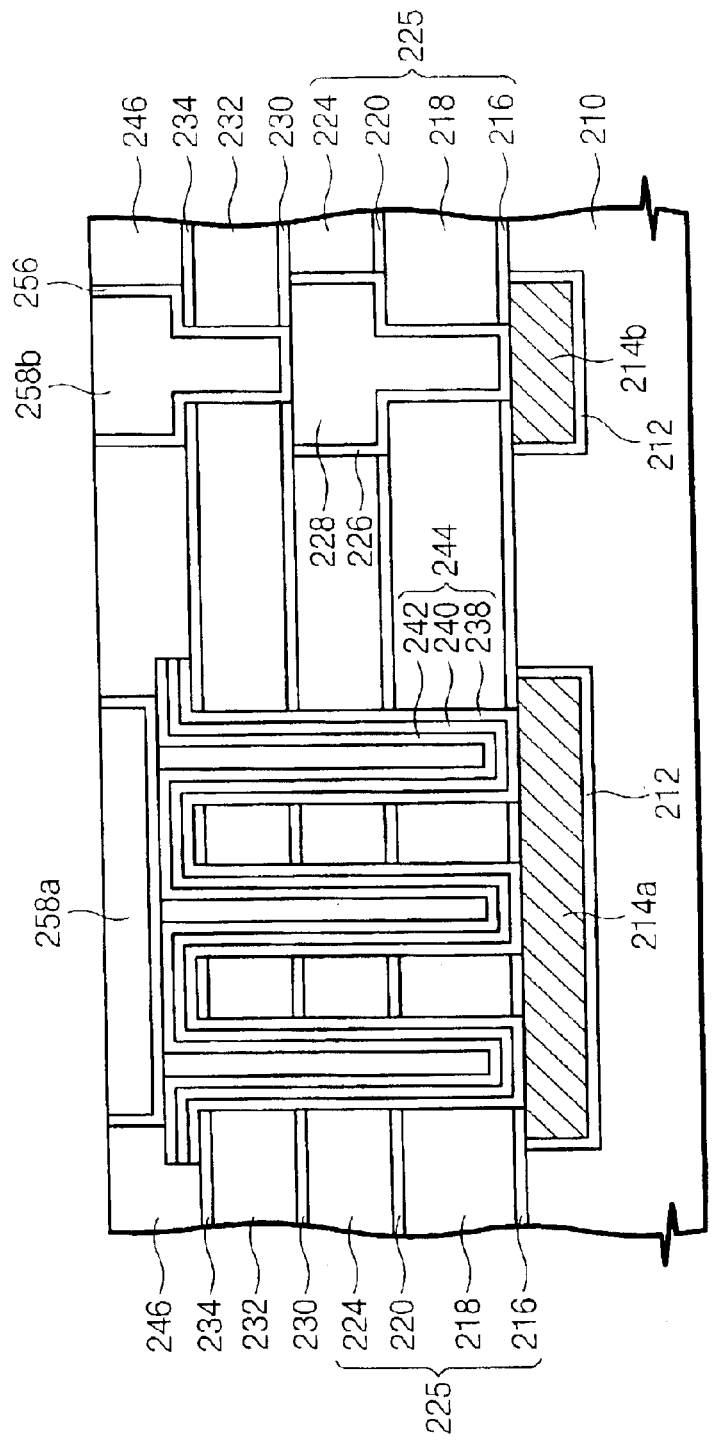

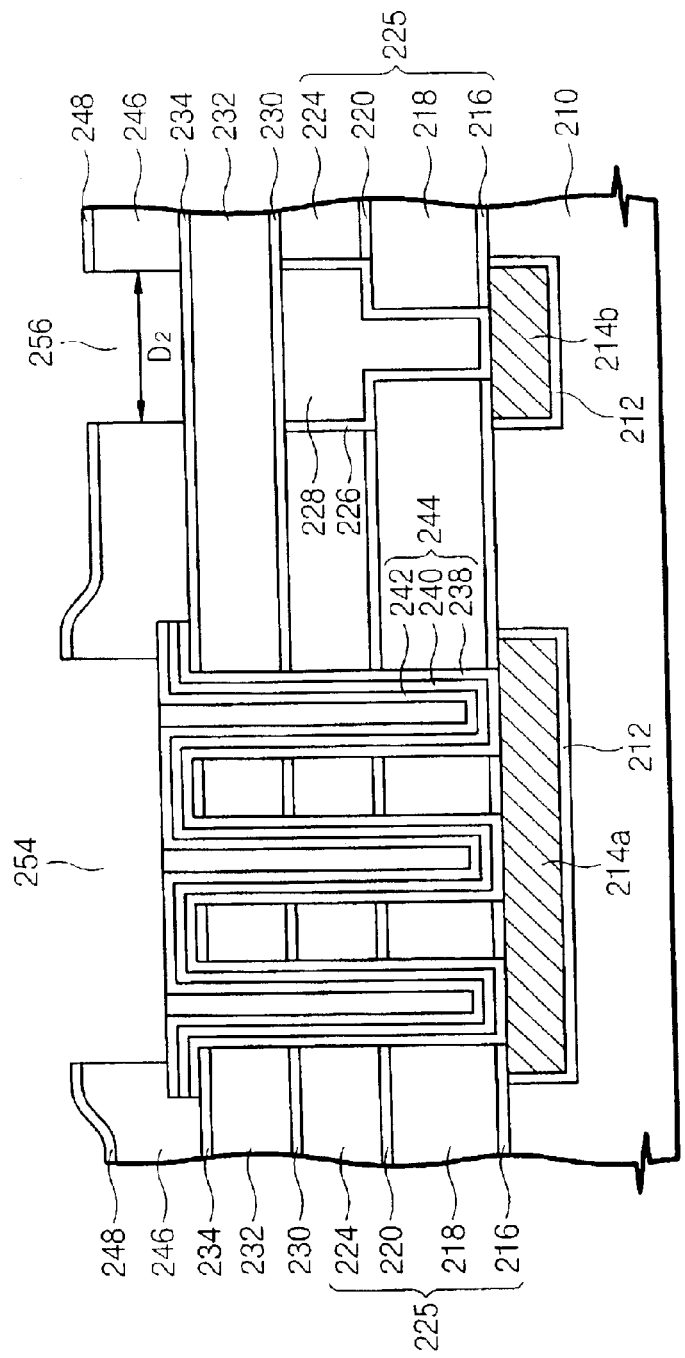

the present invention relates to a semiconductor device having a capacitor of a metal-insulator-metal (MIM) structure and a method of forming the same.

SEMICONDUCTOR DEVICE HAVING METAL-INSULATOR-METAL CAPACITOR AND FABRICATION METHOD THEREOF

FIELD OF THE INVENTION

The present invention relates to a semiconductor device and a method of forming the same. More particularly, the present invention relates to a semiconductor device having a capacitor of a metal-insulator-metal (MIM) structure and a method of forming the same.

BACKGROUND OF THE INVENTION

A capacitor, which is a passive device, is used for various purposes in composing logic devices. For example, a decoupling capacitor is used in a microprocessor unit (MPU), and a capacitor array is used in a digital-to-analog (DA) converter. However, as operation frequency and bit number of the converter are increased, a capacitor with high capacitance is required.

In order to retain capacitance of a capacitor in a limited unit area to be a proper value or higher, since $C=\epsilon As/d$ (here, C is a capacitance, $\epsilon$ is dielectric constant, As is surface area of a capacitor electrode, and d is thickness of a dielectric substance), the thickness d of a dielectric substance should be decreased, the surface area As of a capacitor electrode should be increased, or a material with a high dielectric constant should be used.

An effective surface area of a conventional analog capacitor is planar since a metal interconnection thereof is used as an upper electrode and a bottom electrode.

FIGS. 1A through 1E illustrate cross-sectional views illustrating a method of fabricating a semiconductor device having an MIM capacitor according to a conventional method.

Referring to FIG. 1A, after forming an interlayer dielectric layer 2, a metal conductive layer is formed on the interlayer dielectric layer 2 and is patterned to form a bottom electrode 4a of a capacitor and a bottom interconnection 4b. Although not illustrated in the figures, the interlayer dielectric layer 2 covers semiconductor devices formed on a semiconductor substrate. An intermetal dielectric layer is formed on the bottom electrode 4a of the capacitor and on the bottom interconnection 4b and is planarized.

Referring to FIG. 1B, a contact hole 8 is formed using a conventional photo lithography process to expose the bottom electrode 4a of the capacitor. The contact hole 8 exposing the bottom electrode becomes an effective wide surface area of the capacitor.

Referring to FIG. 1C, a dielectric layer 10 is formed at an entire surface of the semiconductor substrate comprising the contact hole 8.

Referring to FIG. 1D, a via hole 12 is formed using conventional photo lithography to exposed the bottom interconnection 4b. The via hole 12 electrically connects the bottom interconnection and an upper interconnection and is narrower than the contact hole 8.

Referring to FIG. 1E, an upper interconnection conductive layer is formed at an entire surface and patterned to form an upper electrode 14a of the capacitor and an upper interconnection 14b.

The described conventional MIM capacitor has a planar effective surface area so that the capacitance of the capacitor is limited.

SUMMARY OF THE INVENTION

It is a feature of the present invention to provide a semiconductor device and a method of forming the same, which has a three-dimensional MIM capacitor formed through at least one interlayer dielectric layer to increase the effective surface area thereof.

The present invention is directed to a semiconductor device. In the semiconductor device of the invention, a bottom interconnection is disposed over a semiconductor substrate. An intermetal dielectric layer is formed over the semiconductor substrate having the bottom interconnection. A plurality of openings are disposed to expose the bottom interconnection through the intermetal dielectric layer. Planar shape of the opening can be hole-type, stripe-type, or mesh-type shape. A bottom electrode, a dielectric layer, and an upper electrode are conformally stacked on the inside wall of the openings, on the exposed bottom interconnection and on the intermetal dielectric layer between the openings. Because the inside wall of the opening is used as an effective surface area of a capacitor, capacitance of the capacitor can be increased in comparison to a conventional technique. An upper interconnection is disposed on the upper electrode to be electrically connected thereto.

In another aspect, the invention is directed to a method of forming a semiconductor device. In the method, a bottom interconnection is formed over a semiconductor substrate. An intermetal dielectric layer is formed on the bottom interconnection. The intermetal dielectric layer is penetrated to form a plurality of openings exposing the bottom interconnection. Planar shape of the opening can be hole-type, stripe-type, or mesh-type. A bottom electrode conductive layer, a dielectric layer and an upper electrode conductive layer are sequentially and conformally formed on the inside wall of the openings, on the exposed bottom interconnection and on the intermetal dielectric layer between the openings, and patterned to form a capacitor pattern. An upper interconnection is formed on the capacitor pattern.

BRIEF DESCRIPTION OF THE DRAWINGS

FIGS. 10A through 10H contain process cross-sectional views illustrating a method of forming a hole-type capacitor at a metal interconnection of three layers using a damascene process according to a seventh embodiment of the present invention.

FIGS. 11A and 11B contain process cross-sectional views illustrating a method of forming a hole-type capacitor at a metal interconnection of three layers using a damascene process according to a eighth embodiment of the present invention.

DESCRIPTION OF THE PREFERRED EMBODIMENT

A semiconductor device of the present invention will now be described more fully hereinafter with reference to the accompanying drawings.

In the present invention, an effective surface area per a unit planar area of a capacitor with an MIM structure is enlarged to increase capacitance thereof. That is, the capacitor according to the present invention has a three-dimensional structure to maximize capacitance, and a planar shape thereof is hole-type, stripe-type and mesh-type.

Figure 1A:
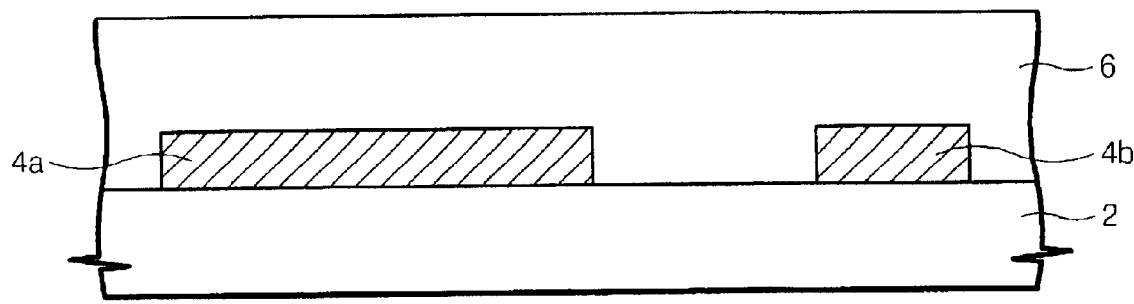
FIGS. 1A through 1E contain cross-sectional views illustrating a method of fabricating a semiconductor device having an MIM capacitor according to a conventional method.
Figure 1B:
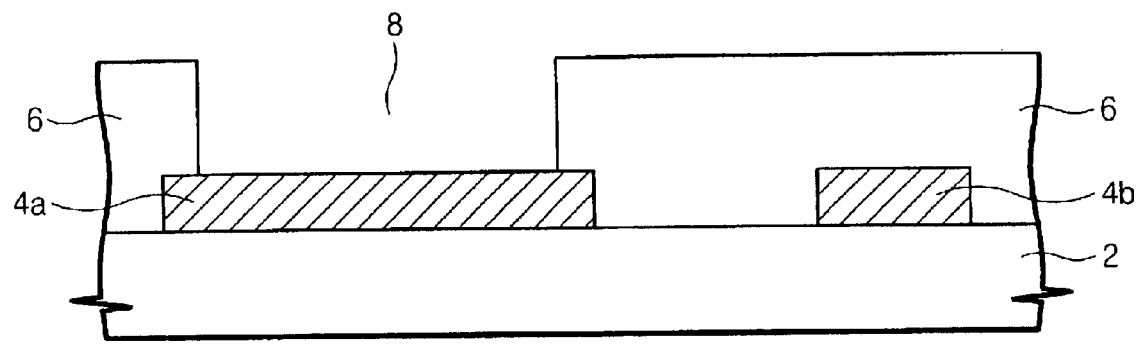
Figure 1C:
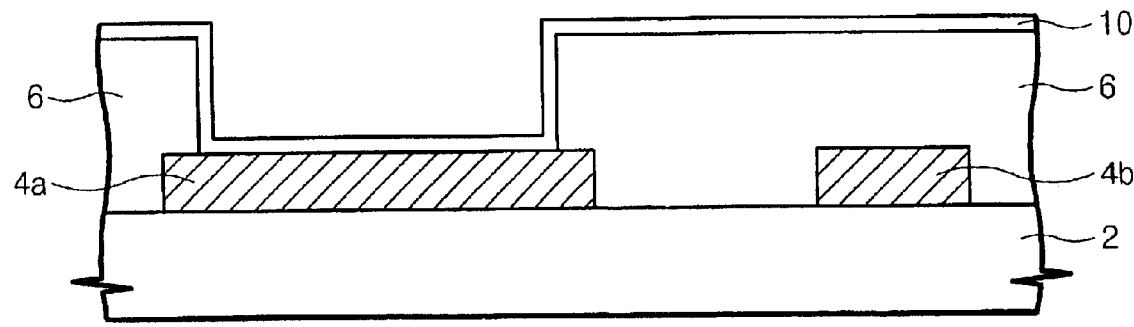
Figure 1D:
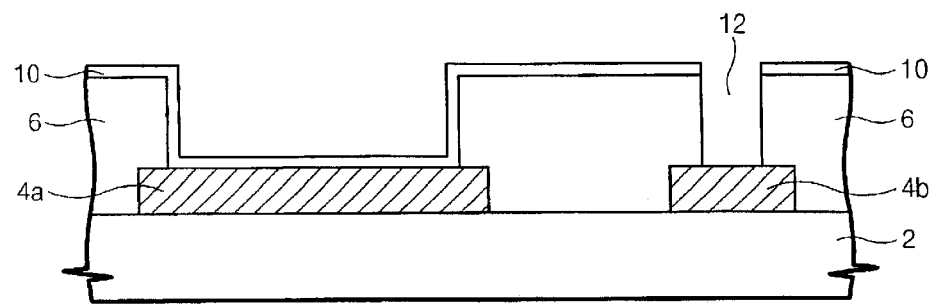
Figure 1E:
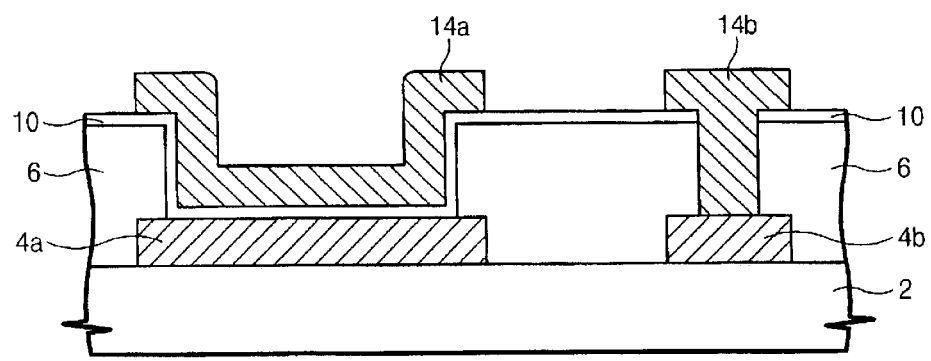
Figure 2A:
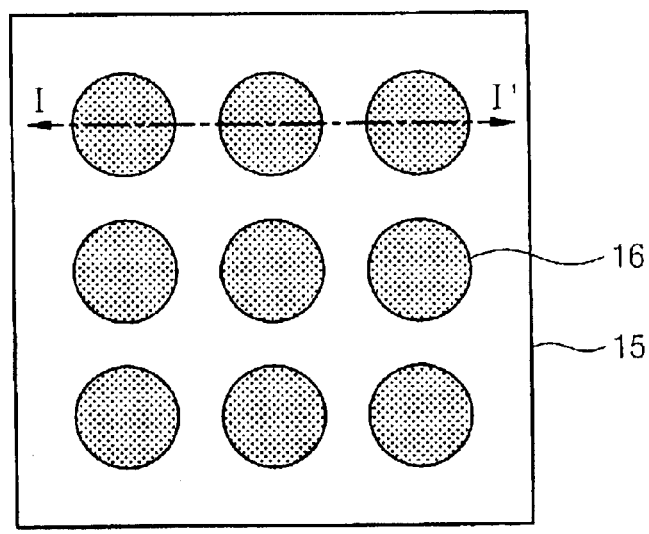
FIGS. 2A through 2C illustrate plan views of MIM capacitors according to embodiments of the present invention.
Figure 2B:
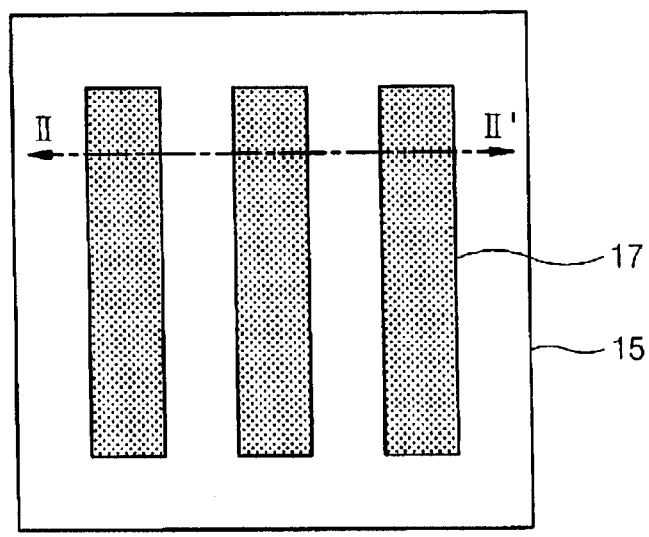
Figure 2C:
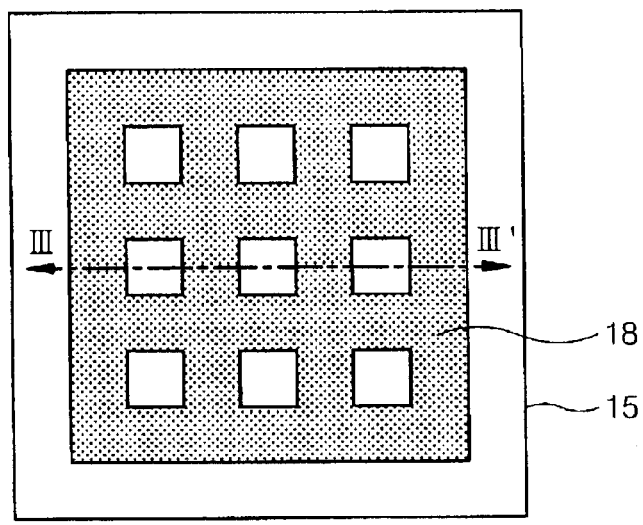

FIGS. 2A through 2C illustrate plan views of capacitors according to embodiments of the present invention.

In FIG. 2A with respect to a hole-type capacitor, nine three-dimensional hole-type capacitor regions 16 are in a capacitor region 15.

In FIG. 2B with respect to a stripe-type capacitor, three stripe-type capacitor regions 17 are in a capacitor region 15.

In FIG. 2C with respect to a mesh-type capacitor, a 3×3 mesh-type capacitor region 18 is in a capacitor region 15.

Figure 3A:
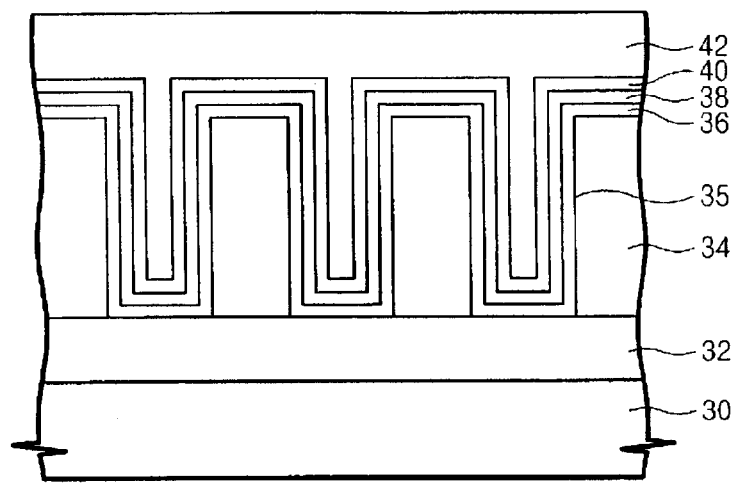
FIG. 3A illustrates a cross-sectional view taken along line I–I' of a capacitor of FIG. 2A or along line II–II' of a capacitor of FIG. 2B.
Figure 3B:
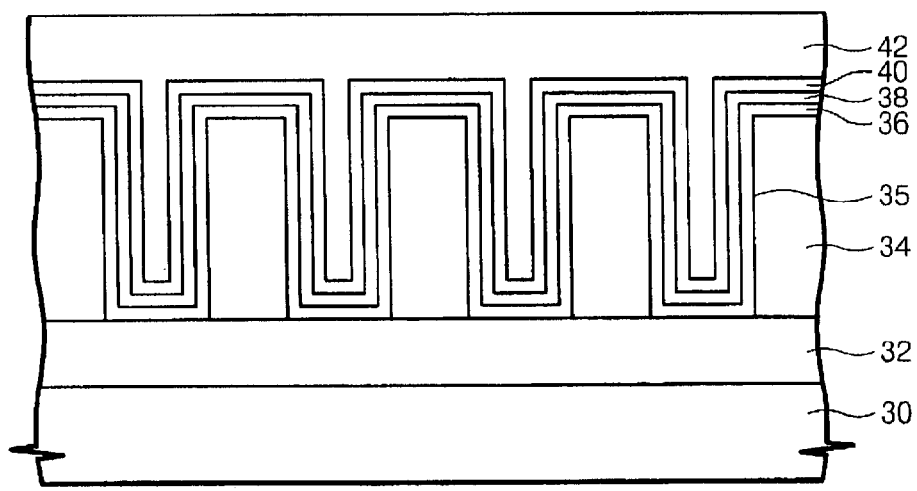
FIG. 3B illustrates a cross-sectional view taken along line III–III' of a capacitor of FIG. 2C.

FIG. 3A illustrates a cross-sectional view taken along line I–I' of a capacitor of FIG. 2A or along line II–II' of a capacitor of FIG. 2B. FIG. 3B illustrates a cross-sectional view taken along line III–III' of a capacitor of FIG. 2C. FIGS. 3A and 3B use the same reference numbers for convenience.

Referring to FIGS. 3A and 3B, a bottom interconnection 32 is formed on an interlayer dielectric layer 30 and an intermetal dielectric layer 34 is formed on the bottom interconnection 32. A plurality of openings 35 are formed through the intermetal dielectric layer 34 to expose the bottom interconnection 32. A bottom electrode 36 of a capacitor and a dielectric layer 38 and an upper electrode 40 of the capacitor are formed on the intermetal dielectric layer 34 between the openings 35, on the inner sidewall of the opening 35 and on the surface of the exposed bottom interconnection 32. An upper interconnection 42 is formed on the upper electrode 40 of the capacitor.

Because the above-mentioned three-dimensional capacitor of the present invention has a concave-convex structure in comparison with a conventional simple plan-type capacitor, capacitance of the capacitor according to the present invention is high.

A method of forming a semiconductor device having a hole-type capacitor of MIM structure will now be described more fully hereinafter with reference to the accompanying drawings according to the present invention. A semiconductor device having a stripe-type or mesh-type capacitor can be formed by using similar methods.

FIGS. 4A through 4F illustrate process cross-sectional views for showing a method of forming a hole-type capacitor at a metal interconnection of two layers according to a first embodiment of the present invention.

Figure 4A:
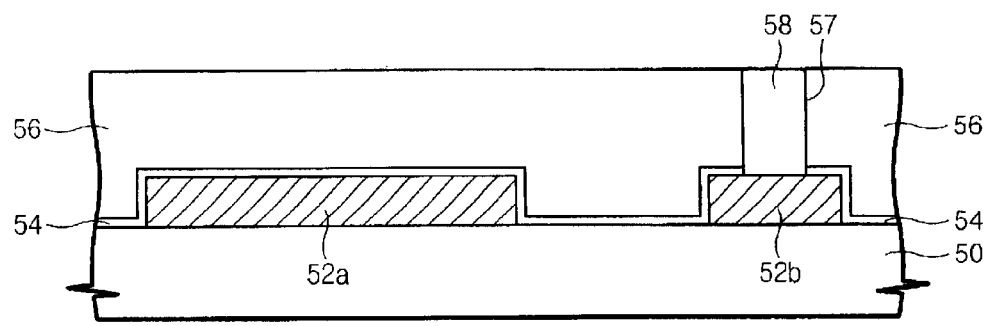
FIGS. 4A through 4F contain process cross-sectional views illustrating a method of forming a hole-type capacitor at a metal interconnection of two layers according to a first embodiment of the present invention.

Referring to FIG. 4A, after forming an interlayer dielectric layer 50, a bottom interconnection conductive layer is formed on the interlayer dielectric layer 50 and is patterned to form bottom interconnections 52a and 52b.

Although not shown in the figures, the interlayer dielectric layer 50 covers semiconductor devices formed on a semiconductor substrate. The bottom interconnections 52a and 52b are composed of a first bottom interconnection 52a and a second bottom interconnection 52b. The bottom interconnection conductive layer can be formed of a material selected from a group comprising aluminum (Al), aluminum-alloy, copper (Cu), gold (Au), silver (Ag), tungsten (W) and molybdenum (Mo), and with a thickness of about 1,000~10,000 Å.

An etch stopping layer 54 can be formed at an entire surface of the semiconductor substrate where the bottom interconnections 52a and 52b are formed. The etch stopping layer 54 can be formed of silicon nitride ($Si_3N_4$), silicon carbide (SiC) or silicon carbonitride (SiCN) deposited using plasma enhanced chemical vapor deposition (PECVD) with a thickness of about 100~1,000 Å.

An intermetal dielectric layer 56 is formed on the etch stopping layer 54 and is planarized. The intermetal dielectric layer 56 may be formed of a low-k dielectric material (here, the low-k dielectric material means a material whose dielectric constant is low) or a material selected from a group comprising $SiO_2$, SiOC, SiOH, and SiOCH. By using the low-k material as the intermetal dielectric layer 56, interconnection resistance and parasitic capacitance between interconnections can be reduced and speed of the semiconductor device can be improved. Additionally, crosstalk of the semiconductor device can be suppressed. The intermetal dielectric layer 56 can be formed using PECVD, HDP-CVD (High Density Plasma CVD), APCVD (Atmospheric Pressure CVD), or spin coating, with a thickness of 3,000~10,000 Å.

The intermetal dielectric layer 56 and the etch stopping layer 54 are selectively etched using a photoresist pattern to form a via hole 57.

A barrier metal layer (not illustrated in figures) and a conductive material (not illustrated in figures) are formed at the semiconductor substrate having the via hole 57, to fill the via hole 57. The barrier metal layer and the conductive material are planarized to form a conductive contact plug 58 in the via hole and to expose the intermetal dielectric layer 56. The barrier metal layer can be formed of at least one material selected from a group comprising Ta, TaN, TiN, WN, TaC, WC, TiSiN, and TaSiN, using PVD (Physical Vapor Deposition), CVD (Chemical Vapor Deposition) or ALD (Atomic Layer Depostion). The conductive material can be formed of tungsten.

Figure 4B:
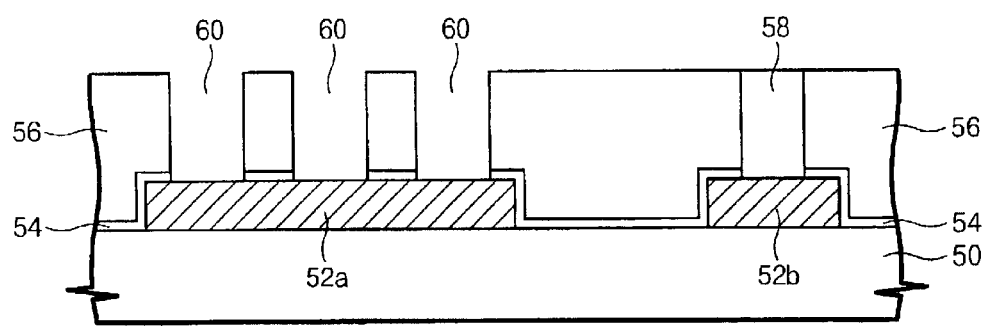

Referring to FIG. 4B, the intermetal dielectric layer 56 and the etch stopping layer 54 are selectively etched using a photoresist pattern to form a plurality of openings 60 exposing the first bottom interconnection 52a. In FIG. 4B, there are three openings 60.

Figure 4C:
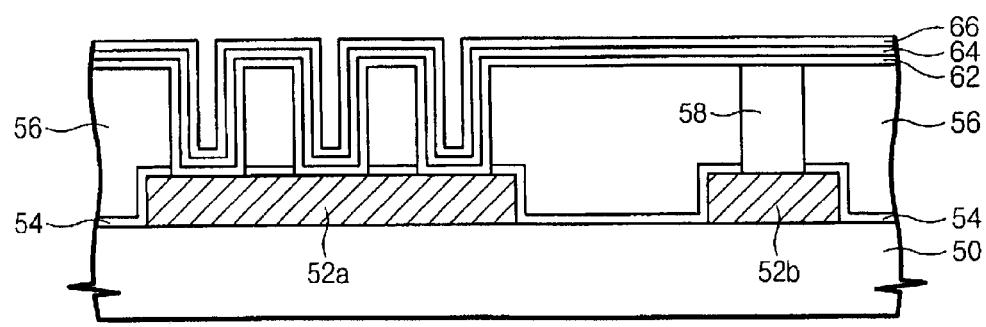

Referring to FIG. 4C, a bottom electrode conductive layer 62, a dielectric layer 64, and an upper electrode conductive layer 66 are formed at an entire surface of the semiconductor substrate where the openings 60 are formed.

The bottom and upper electrode conductive layers 62 and 66 are formed of a material selected from a group comprising Ti, TiN, Ta, TaN, Pt, Ru, Ir, and W, and with a thickness of 300~5,000 Å.

The dielectric layer 64 can be formed of a material selected from a group comprising silicon oxide, silicon nitride, tantalum oxide, barium-strontium-titanium oxide, zirconium oxide, hafnium oxide, lead-zirconium-titanium oxide, and strontium-bismuth-tantalum oxide, using a method selected from a group of comprising CVD, PCVD, and ALD, and with a thickness of 100~2,000 Å.

Figure 4D:
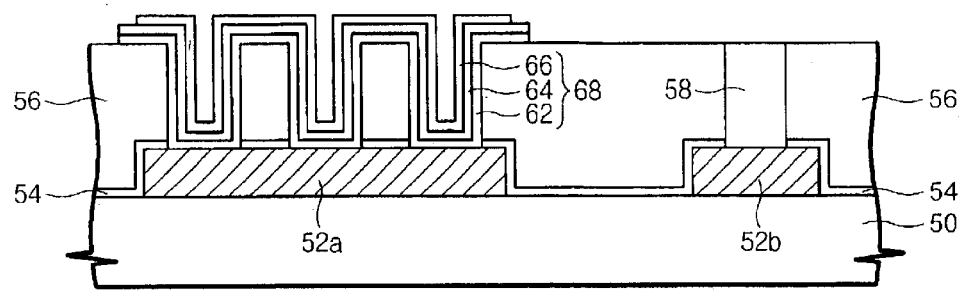

Referring to FIG. 4D, the upper electrode conductive layer 66, the dielectric layer 64, and the bottom electrode conductive layer 62 are selectively etched using a photoresist pattern to form a capacitor pattern 68. Because of a concave-convex structure along the inside wall of the openings 60, the exposed surface of the first bottom interconnection 52a, and the intermetal dielectric layer 56, the capacitor pattern 68 has a wider effective surface area in comparison to the conventional technique. That is, by using the inside wall of the openings, the capacitance of the capacitor can be increased.

In the case that the upper electrode conductive layer 66, the dielectric layer 64, and the bottom electrode conductive layer 62 are simultaneously dry-etched, the capacitor pattern 68 has a vertical structure. In a subsequent process of forming and patterning a conductive layer to an upper interconnection, a conductive fence can remain at a sidewall of the capacitor pattern 68 having the vertical structure to result in a bridge phenomenon in which current flows between an upper electrode and a bottom electrode.

In order to prevent the bridge phenomenon, after forming the capacitor pattern 68 having the vertical structure, an insulation layer (not illustrated in figures) is formed to cover the capacitor pattern 68. And the insulation layer is anisotropically etched to form an insulation spacer on a sidewall of the capacitor pattern 68 having the vertical structure. Alternatively, as illustrated in FIG. 4D, two photolithography processes are carried out. That is, the upper electrode conductive layer 66 is first patterned, and the dielectric layer 64 and the bottom electrode conductive layer 62 are simultaneously patterned.

Figure 4E:
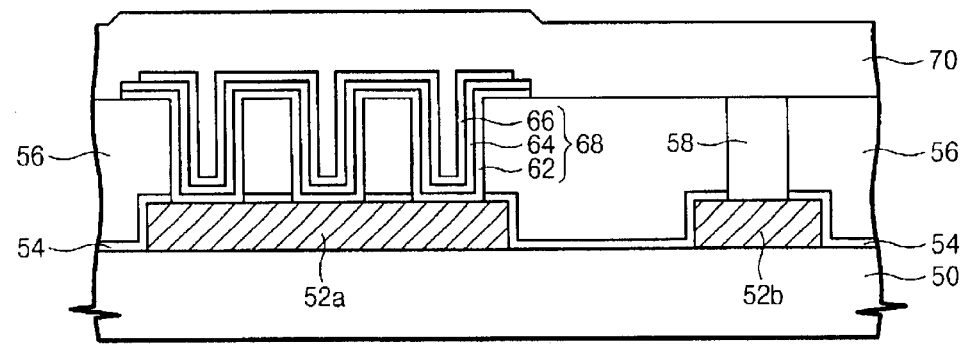

Referring to FIG. 4E, an upper interconnection conductive layer 70 is formed at an entire surface of the semiconductor substrate having the capacitor pattern 68. The sequences of forming the upper interconnection conductive layer 70 are identical with those of forming the described bottom interconnection conductive layer.

Figure 4F:
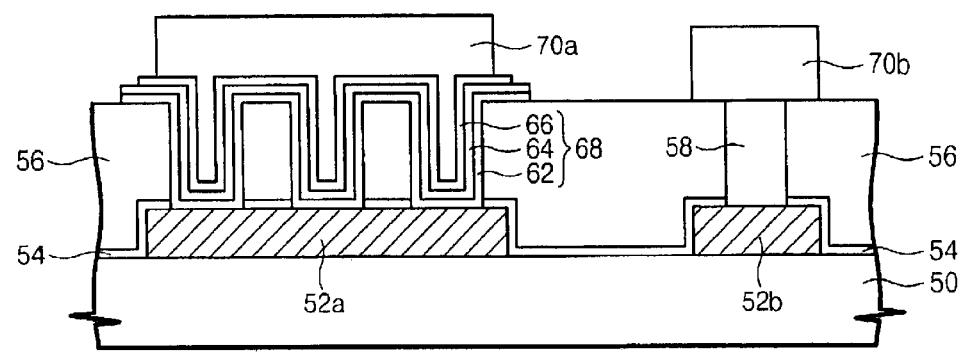

Referring to FIG. 4F, the upper interconnection layer 70 is selectively etched to form upper interconnections 70a, and 70b. The upper interconnections are composed of a first upper interconnection 70a and a second upper interconnection 70b.

Embodiment 2

FIGS. 5A through 5F illustrate process cross-sectional views for showing a method of forming a hole-type capacitor at a metal interconnection of two layers according to a second embodiment of the present invention.

Figure 5A:
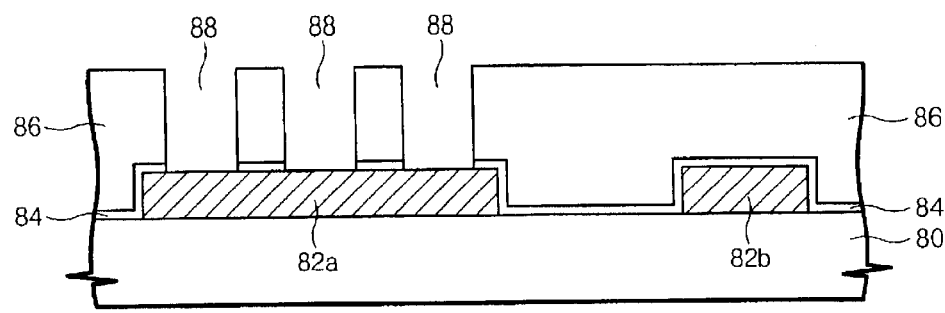
FIGS. 5A through 5F contain process cross-sectional views illustrating a method of forming a hole-type capacitor at a metal interconnection of two layers according to a second embodiment of the present invention.

Referring to FIG. 5A, after forming an interlayer dielectric layer 80, a bottom interconnection conductive layer is formed on the interlayer dielectric layer 80 and is patterned to form bottom interconnections 82a and 82b. Although not shown in the figures, the interlayer dielectric layer covers semiconductor devices formed on a semiconductor substrate. The bottom interconnections are composed of a first bottom interconnection 82a and a second bottom interconnection 82b. The method of forming the bottom interconnection conductive layer is identical with that the first embodiment. An etch stopping layer 84 is formed at an entire surface of the semiconductor substrate having the bottom interconnections 82a and 82b. An intermetal dielectric layer 86 is formed on the etch stopping layer 84. A method of forming the etch stopping layer 84 and the intermetal dielectric layer 86 is the same as that of the first embodiment.

The intermetal dielectric layer 86 and the etch stopping layer 84 are selectively etched to form a plurality of openings 88 exposing predetermined regions of the first bottom interconnections 82a. In FIG. 5A, there are three openings.

Figure 5B:
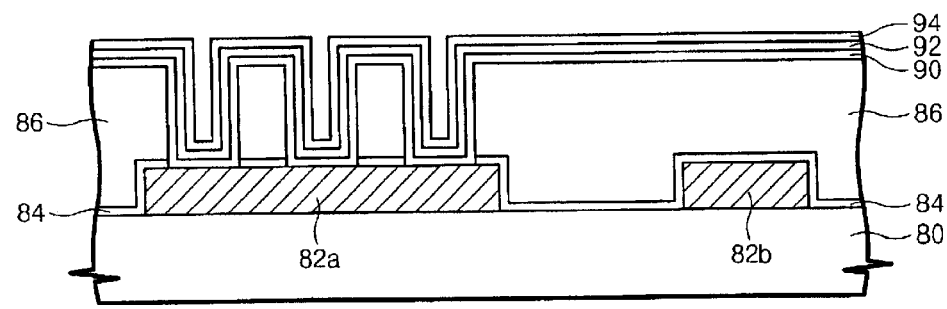

Referring to FIG. 5B, a bottom electrode conductive layer 90, a dielectric layer 92, and an upper electrode conductive layer 94 are formed at an entire surface of the semiconductor substrate having the openings 88. A method of forming the bottom electrode conductive layer 90, the dielectric layer 92, and the upper electrode conductive layer 94 is identical to that of the first embodiment.

Figure 5C:
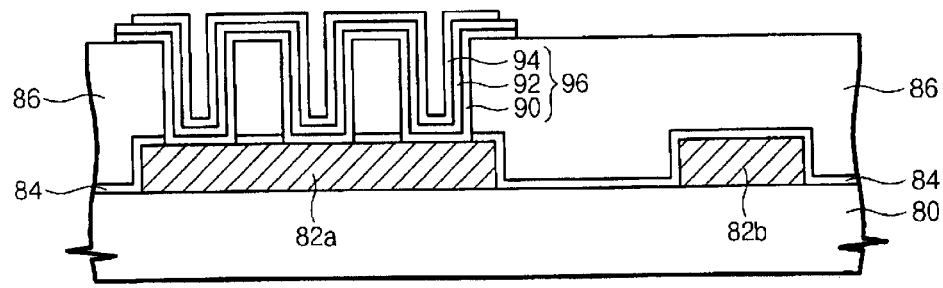

Referring to FIG. 5C, the upper electrode conductive layer 94, the dielectric layer 92 and the bottom electrode conductive layer 90 are selectively etched to form a capacitor pattern 96.

Because of a concave-convex structure along the inside wall of the openings 88, the exposed surface of the first bottom interconnection 82a, and the intermetal dielectric layer 86, the capacitor pattern 96 has a wider effective surface area in comparison to the conventional technique. That is, by using the inside wall of the openings 88, the capacitance of the capacitor can be increased.

In the case that the upper electrode conductive layer, the dielectric layer, and the bottom electrode conductive layer are simultaneously dry-etched, the capacitor pattern 96 has a vertical structure. Thus, as described in the first embodiment, in order to prevent a bridge phenomenon, an insulation spacer is formed. Alternatively, as illustrated in FIG. 5C, the upper electrode conductive layer 94 is first patterned, and the dielectric layer 92 and the bottom electrode conductive layer 90 are simultaneously patterned.

Figure 5D:
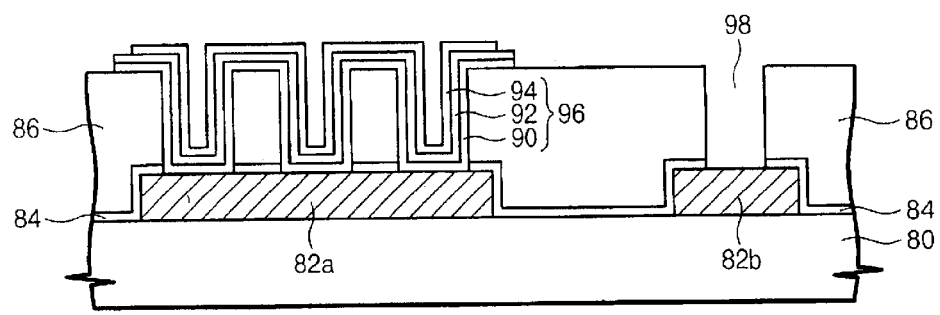

Referring to FIG. 5D, the intermetal dielectric layer 86 and the etch stopping layer 84 are selectively etched using a photoresist pattern, to form a via hole 98 exposing a predetermined region of the second bottom interconnection 82b.

Figure 5E:
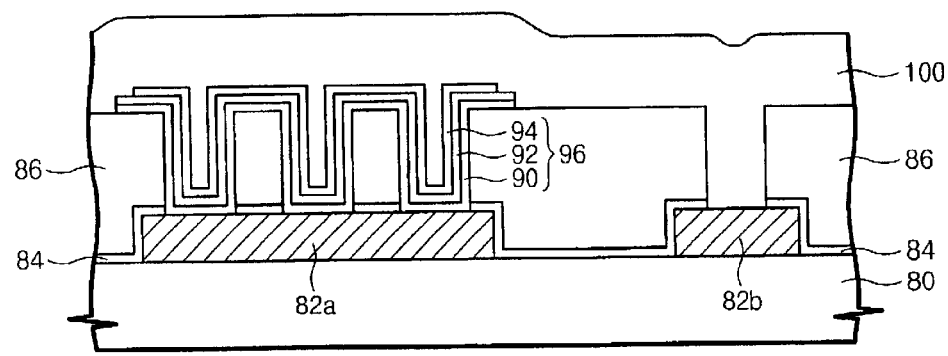

Referring to FIG. 5E, an upper interconnection conductive layer 100 is formed at an entire surface of the semiconductor substrate where the via hole 98 is formed. The method of forming the upper interconnection conductive layer 100 is identical to that of the first embodiment. Although not shown in figures, before forming the upper interconnection conductive layer 100, a barrier metal layer can be formed.

According to an aspect of the present embodiment, a conductive plug cannot be formed in comparison to the first embodiment. Because the capacitor pattern 96 on the intermetal dielectric layer 86 can be removed during a CMP process with respect to the upper interconnection conductive layer 100. Thus, an upper interconnection and a conductive contact plug should be simultaneously formed using the upper interconnection conductive layer filling the via hole.

Figure 5F:
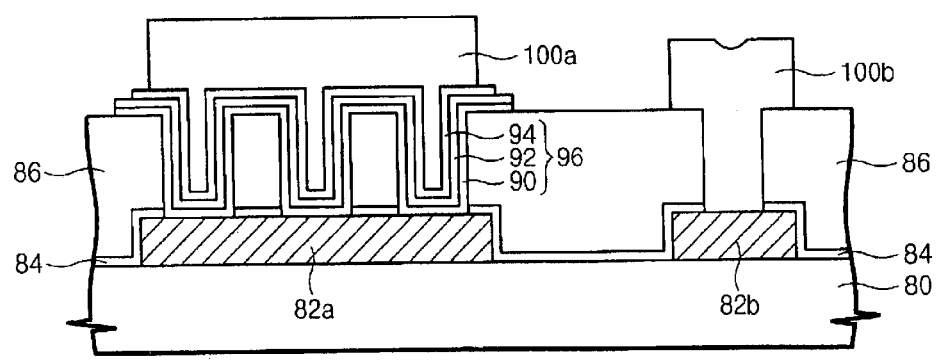

Referring to FIG. 5F, the upper interconnection conductive layer 100 is selectively etched using a photoresist pattern to form upper interconnections 100a and 100b. The upper interconnections are composed of a first upper interconnection 100a and a second upper interconnection 100b.

Embodiment 3.

FIGS. 6A through 6F illustrate process cross-sectional views for showing a method of forming a hole-type capacitor at a metal interconnection of three layers according to a third embodiment of the present invention. In the present invention, a capacitor of an MIM structure can be formed through at least one intermetal dielectric layer. In the case that the capacitor is formed through a plurality of intermetal dielectric layers, capacitance of the capacitor is increased due to an increase of the height thereof.

Figure 6A:
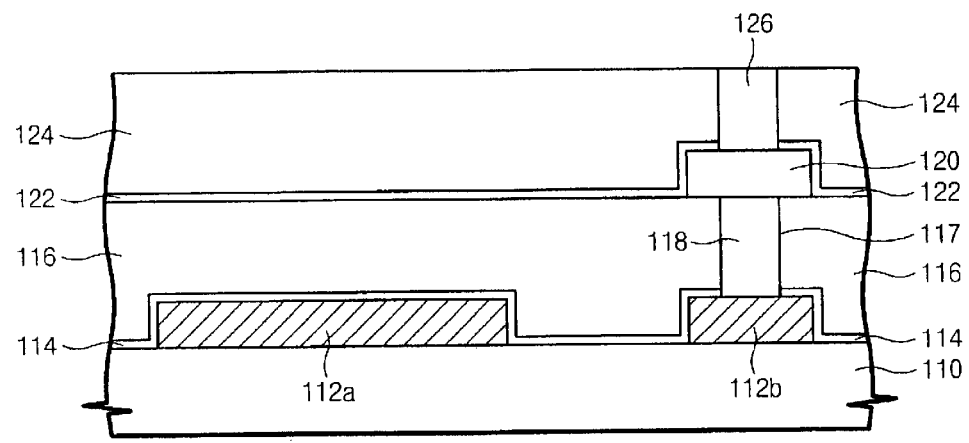
FIGS. 6A through 6F contain process cross-sectional views illustrating a method of forming a hole-type capacitor at a metal interconnection of three layers according to a third embodiment of the present invention.

Referring to FIG. 6A, after forming an interlayer dielectric layer 110, a bottom interconnection conductive layer is formed on the interlayer dielectric layer 110 and is patterned to form bottom interconnections 112a and 112b. Although not illustrated in the figures, the interlayer dielectric layer 100 covers semiconductor devices formed on a semiconductor substrate. The bottom interconnections are composed of a first bottom interconnection 112a and a second bottom interconnection 112b. The bottom interconnection conductive layer can be formed of at least one material selected from a group comprising aluminum (Al), aluminum-alloy, copper (Cu), gold (Au), silver (Ag), tungsten (W) and molybdenum (Mo), and with thickness of about 1,000~10,000 Å.

A first etch stopping layer 114 can be formed at an entire surface of the semiconductor substrate where the bottom interconnections 112a and 112b are formed. The first etch stopping layer 114 can be formed of silicon nitride ($Si_3N_4$), silicon carbide (SiC) or silicon carbonitride (SiCN) deposited by using a PECVD method with a thickness of about 100~1,000 Å.

A first intermetal dielectric layer 116 is formed on the etch stopping layer 114 and is planarized. The first intermetal dielectric layer 116 may be formed of a amterial selected from a group comprising $SiO_2$, SiOC, SiOH, and SiOCH, or of a low-k dielectric material whose dielectric constant is lower than 3.0. The first intermetal dielectric layer 116 can be formed using PECVD, HDP-CVD (High Density Plasma CVD), APCVD (Atmospheric Pressure CVD), or spin coating, with a thickness of 3,000~10,000 Å.

The first intermetal dielectric layer 116 and the first etch stopping layer 114 are selectively etched to form a via hole 117.

A barrier metal layer (not illustrated in figures) and a conductive material (not illustrated in figures) are formed at the semiconductor substrate having the via hole 117, to fill the via hole 117. The barrier metal layer and the conductive material are planarized to form a first conductive contact plug 118 in the via hole 117 and to expose the first intermetal dielectric layer 116. The barrier metal layer can be formed of at least one material selected from a group comprising Ta, TaN, TiN, WN, TaC, WC, TiSiN, and TaSiN, using PVD, CVD or ALD. The conductive material can be formed of tungsten.

A middle interconnection conductive layer is formed at an entire surface of the semiconductor substrate having the first conductive contact plug 118, and is patterned to form a middle interconnection 120. The middle interconnection 120 can be formed of the same material as the bottom interconnection.

A second etch stopping layer 122 can be formed at an entire surface of the semiconductor substrate having the middle interconnection 120, and a second intermetal dielectric layer 124 can be formed on the second etch stopping layer 122. The second etch stopping layer 122 can be formed by using the same method as that used in forming the first etch stopping layer 114, and the second intermetal dielectric layer 124 can be formed using the same method as that used in forming the first intermetal dielectric layer 116.

The second intermetal dielectric layer 124 and the second etch stopping layer 122 are selectively etched to form a via hole exposing the middle interconnection 120.

A second conductive contact plug 126 can be formed using the same method as that used in forming the first conductive contact plug 118.

Figure 6B:
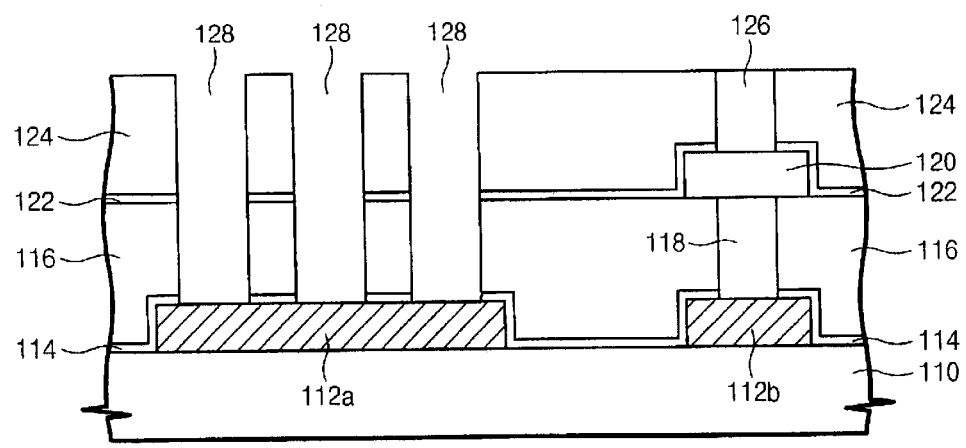

Referring to FIG. 6B, the second intermetal dielectric layer 124, the second etch stopping layer 122, the first intermetal dielectric layer 116 and the first etch stopping layer 114 are selectively etched using a photoresist pattern to form a plurality of openings 128 exposing the first bottom interconnection 112a. In FIG. 6B, there are three openings 128.

Figure 6C:
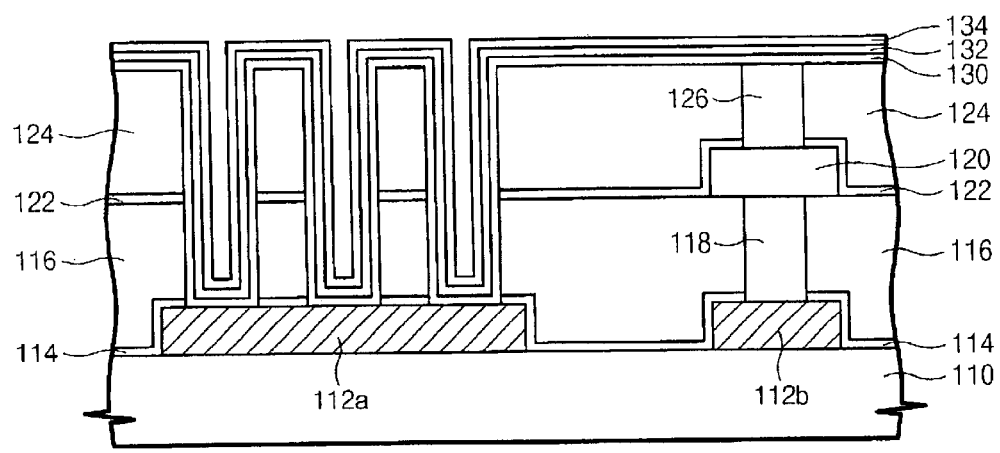

Referring to FIG. 6C, a bottom electrode conductive layer 130, a dielectric layer 132, and an upper electrode conductive layer 134 are formed at an entire surface of the semiconductor substrate where the openings 128 are formed.

The bottom and upper electrode conductive layers 130 and 134 are formed of a material selected from a group comprising Ti, TiN, Ta, TaN, Pt, Ru, Ir, and W, and with a thickness of 300~5,000 Å.

The dielectric layer 132 can be formed of a material selected from a group comprising silicon oxide, silicon nitride, tantalum oxide, barium-strontium-titanium oxide, zirconium oxide, hafnium oxide, lead-zirconium-titanium oxide, and strontium-bismuth-tantalum oxide, using CVD, PCVD, or ALD, and with a thickness of 100~2,000 Å.

Figure 6D:
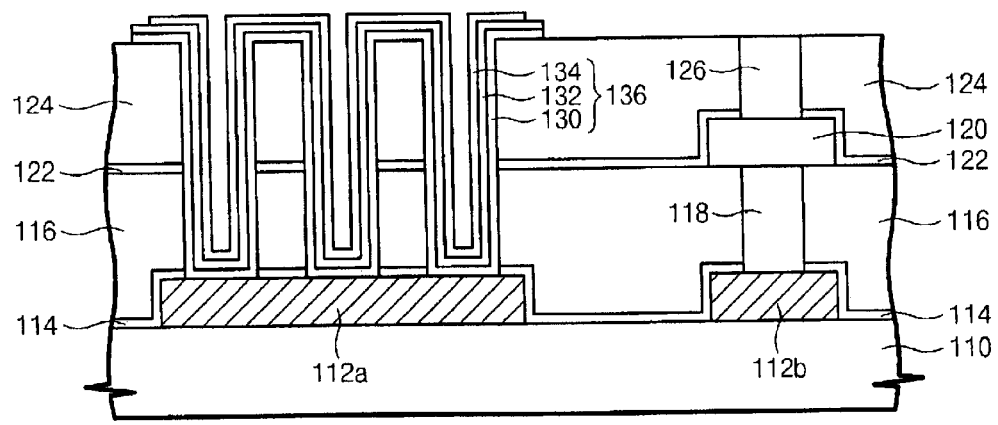

Referring to FIG. 6D, the upper electrode conductive layer 134, the dielectric layer 132, and the bottom electrode conductive layer 130 are selectively etched using a photoresist pattern to form a capacitor pattern 136. Because of a concave-convex structure along the inside wall of the openings 128, the exposed surface of the first bottom interconnection 112a, and the intermetal dielectric layer 124, the capacitor pattern 136 has a wider effective surface area in comparison to the conventional technique. That is, using the inside wall of the openings 128, the capacitance of the capacitor 136 can be increased.

In the case that the upper electrode conductive layer 134, the dielectric layer 132, and the bottom electrode conductive layer 130 are simultaneously dry-etched, the capacitor pattern 136 has a vertical structure as described in the first embodiment. Therefore, in order to prevent a bridge phenomenon which can occur in a subsequent processes, after forming the capacitor pattern having the vertical structure, an insulation spacer can be formed on a sidewall of the capacitor pattern. Alternatively, as illustrated in FIG. 6D, the upper electrode conductive layer 134 is first patterned, and the dielectric layer 132 and the bottom electrode conductive layer 130 are simultaneously patterned.

Figure 6E:
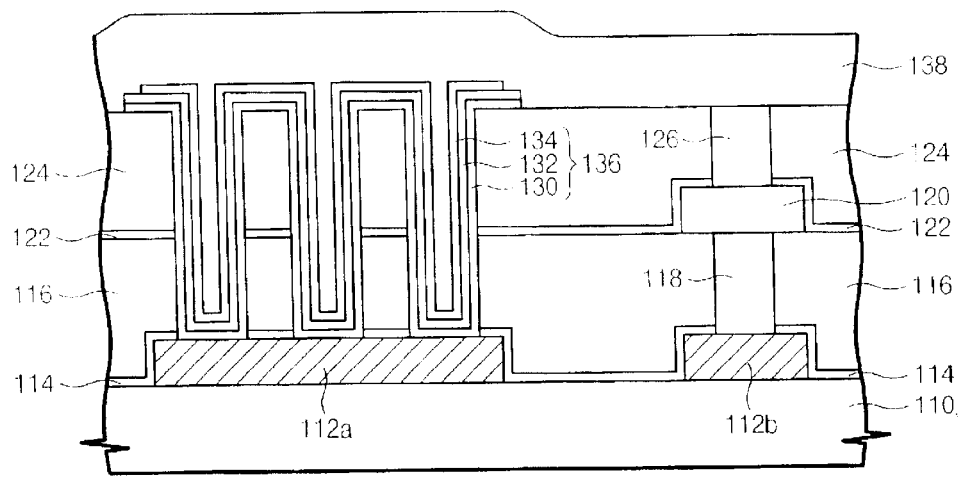

Referring to FIG. 6E, an upper interconnection conductive layer 138 is formed at an entire surface of the semiconductor substrate having the capacitor pattern 136. The upper interconnection conductive layer 138 can be formed of the same material as that of the bottom interconnection conductive layer.

Figure 6F:
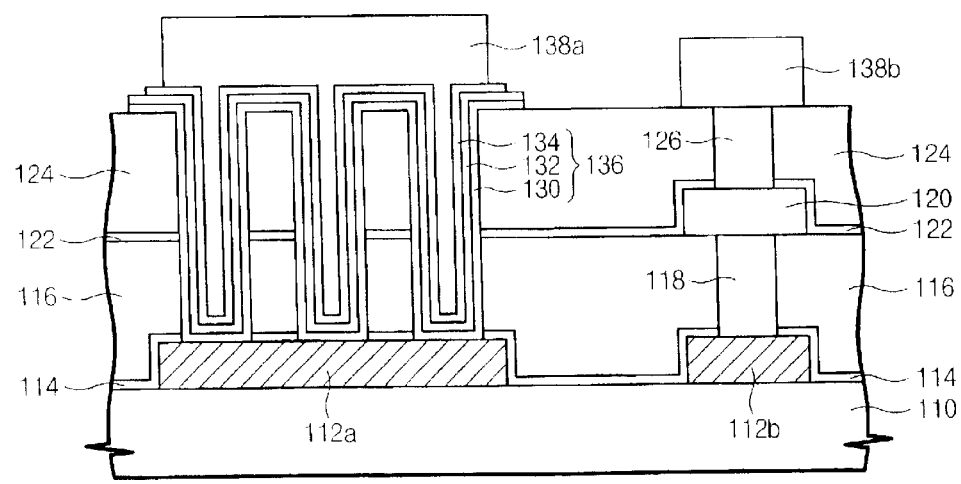

Referring to FIG. 6F, the upper interconnection conductive layer 138 is selectively etched to form upper interconnections 138a and 138b. The upper interconnections are composed of a first upper interconnection 138a and a second upper interconnection 138b.

Embodiment 4.

FIGS. 7A through 7G illustrate process cross-sectional views for showing a method of forming a hole-type capacitor at a metal interconnection of three layers according to a fourth embodiment of the present invention. While a conductive contact plug is formed first in the third embodiment, a capacitor is formed first in the present embodiment.

Figure 7A:
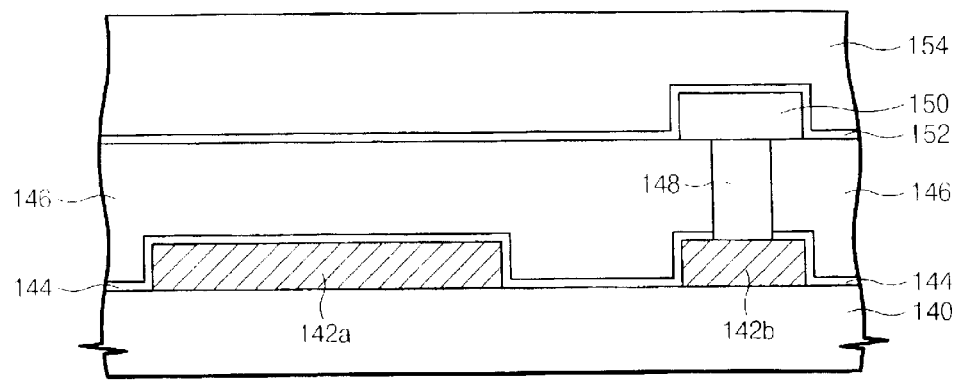
FIGS. 7A through 7G contain process cross-sectional views illustrating a method of forming a hole-type capacitor at a metal interconnection of three layers according to a fourth embodiment of the present invention.

Referring to FIG. 7A, an interlayer dielectric layer 140, a bottom interconnection 142a and 142b, a first etch stopping layer 144, a first intermetal dielectric layer 146, a first contact plug 148, a middle interconnection 150, a first etch stopping layer 152 and a second intermetal dielectric layer 154 can be formed by the same process steps as those of the third embodiment.

Figure 7B:
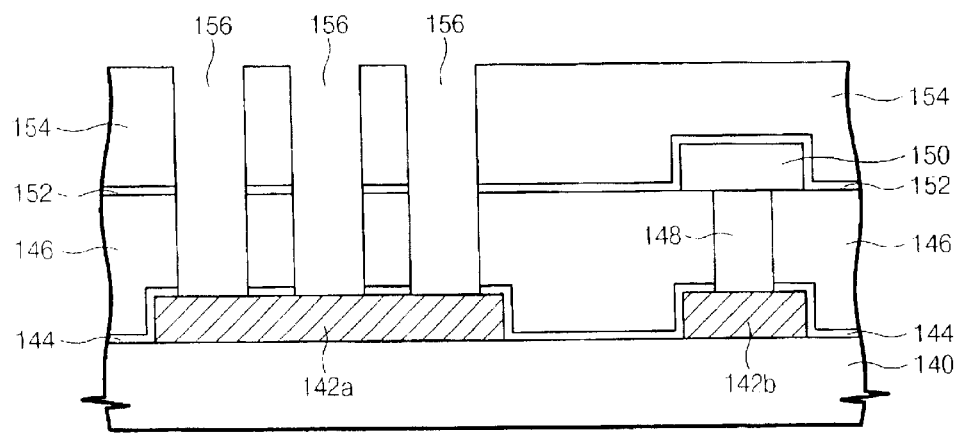

Referring to FIG. 7B, the second intermetal dielectric layer 154, the second etch stopping layer 152, the first intermetal dielectric layer 146 and the first etch stopping layer 144 are selectively etched using a photoresist pattern to form a plurality of openings 156 exposing the first bottom interconnection 142a. In FIG. 7B, there are three openings 158.

Figure 7C:
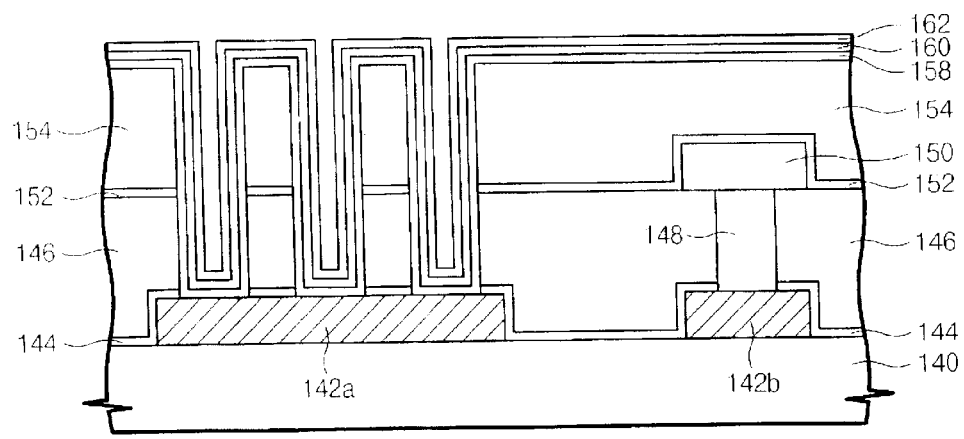

Referring to FIG. 7C, a bottom electrode conductive layer 158, a dielectric layer 160, and an upper electrode conductive layer 162 are formed at an entire surface of the semiconductor substrate where the openings 156 are formed. The bottom electrode conductive layer 158, the dielectric layer 160, and the upper electrode conductive layer 162 can be formed using the same method as that described in the third embodiment.

Figure 7D:
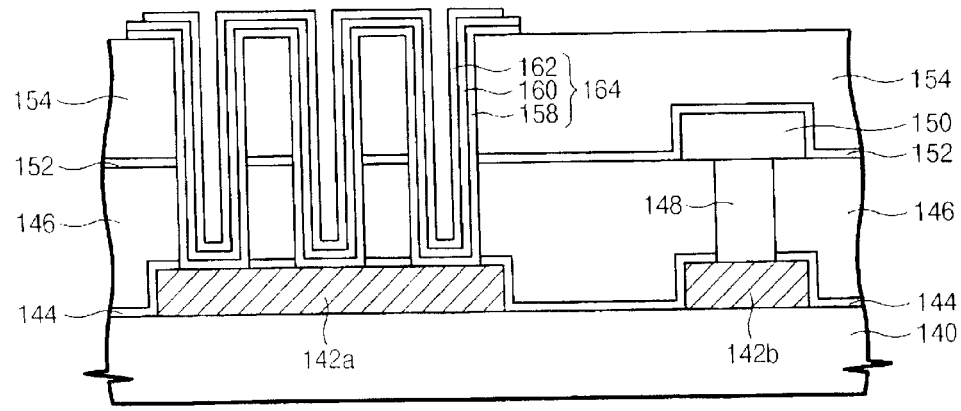

Referring to FIG. 7D, the upper electrode conductive layer 162, the dielectric layer 160, and the bottom electrode conductive layer 158 are selectively etched to form a capacitor pattern 164.

Because of a concave-convex structure along the inside wall of the openings 156, the exposed surface of the first bottom interconnection 142a, and the intermetal dielectric layer 154, the capacitor pattern 164 has a wider effective surface area in comparison to the conventional technique. That is, by using the inside wall of the openings 156, the capacitance of the capacitor 164 can be increased.

In the case that the upper electrode conductive layer 162, the dielectric layer 160, and the bottom electrode conductive layer 158 are simultaneously dry-etched, the capacitor pattern 164 has a vertical structure as described in the first embodiment. Therefore, in order to prevent a bridge phenomenon which can occur in a subsequent process, after forming the capacitor pattern having the vertical structure, an insulation spacer can be formed on a sidewall of the capacitor pattern having the vertical structure. Alternatively, as illustrated in FIG. 7D, the upper electrode conductive layer 162 is first patterned, and then, the dielectric layer 160 and the bottom electrode conductive layer 158 are simultaneously patterned.

Figure 7E:
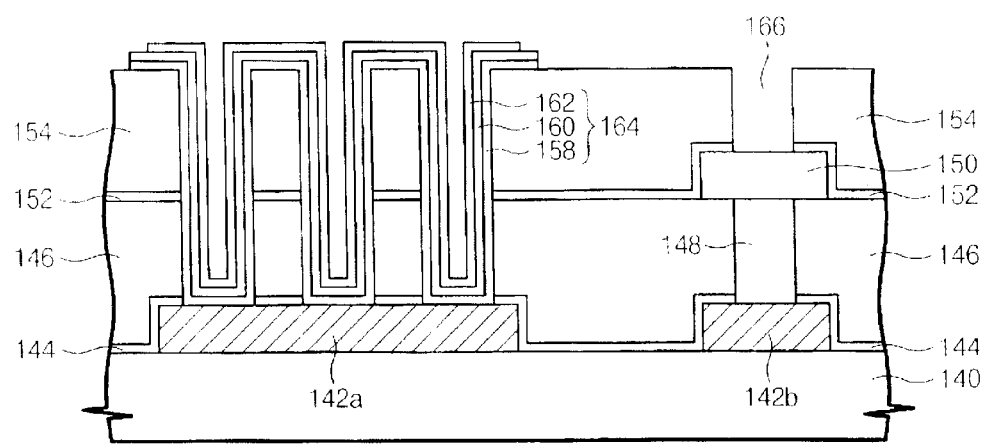

Referring to FIG. 7E, the second intermetal dielectric layer 154 and the second etch stopping layer 152 are selectively etched using a photoresist pattern to form a via hole 166 exposing the middle interconnection 150.

Figure 7F:
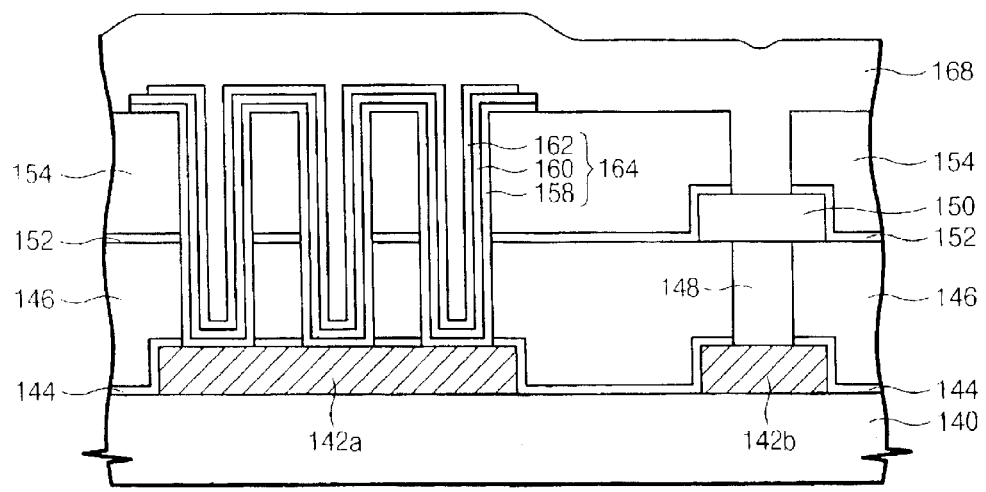

Referring to FIG. 7F, an upper interconnection conductive layer 168 is formed at an entire surface of the semiconductor substrate to fill the via hole 166. Although not illustrated in FIG. 7F, before forming the upper interconnection conductive layer 168, a barrier metal layer can be formed in the via hole 166.

According to an aspect of the present embodiment, a conductive contact plug cannot be formed in comparison to the third embodiment, because the capacitor pattern 164 on the second intermetal dielectric layer 154 can be removed during a CMP process with respect to the upper interconnection conductive layer 168. Thus, an upper interconnection and a conductive contact plug should be simultaneously formed using the upper interconnection conductive layer 168 filling the via hole.

Figure 7G:
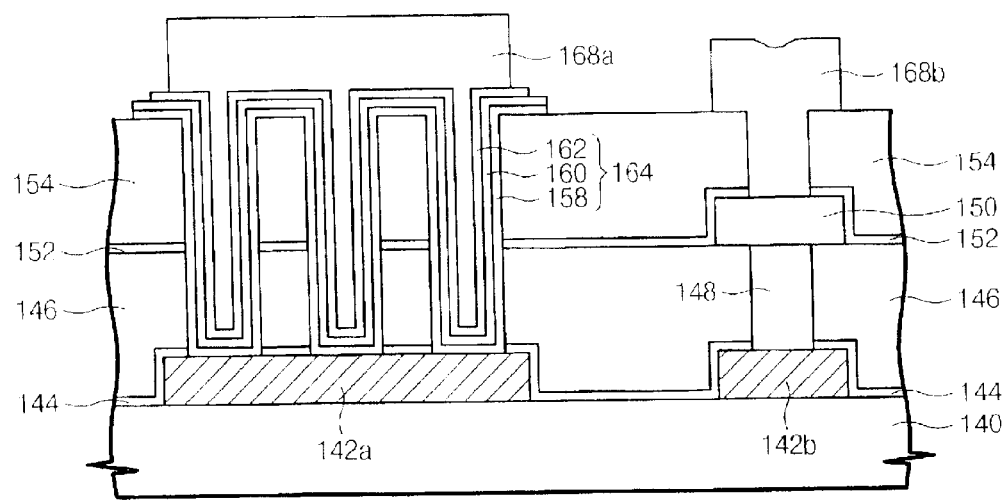

Referring to FIG. 7G, the upper interconnection conductive layer 168 is selectively etched using a photoresist pattern to form upper interconnections 168a and 168b. The upper interconnections are composed of a first upper interconnection 168a and a second upper interconnection 168b.

Embodiment 5.

The fifth through eighth embodiments are directed to methods of forming metal interconnections and MIM capacitors using damascene processes.

FIGS. 8A through 8I illustrate process cross-sectional views for showing a method of forming a hole-type capacitor at a metal interconnection of two layers by using a damascene process according to a fifth embodiment of the present invention. In the present embodiment, a via hole is first formed, and then, an interconnection groove is formed.

Figure 8A:
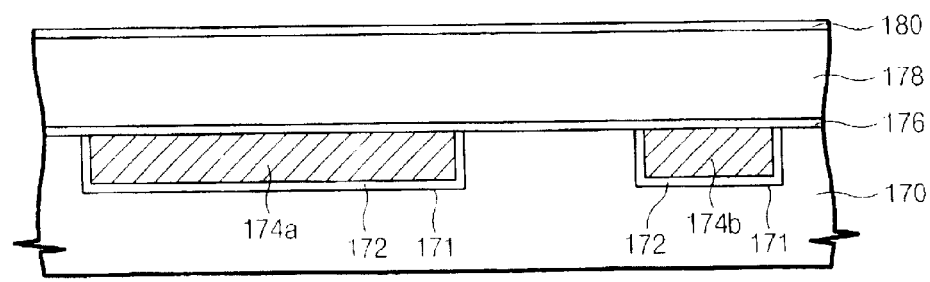
FIGS. 8A through 8I contain process cross-sectional views illustrating a method of forming a hole-type capacitor at a metal interconnection of two layers using a damascene process according to a fifth embodiment of the present invention.

Referring to FIG. 8A, an interlayer dielectric layer 170 is formed on a semiconductor substrate (not illustrated in figures), and is selectively etched to form an interconnection groove 171. Although not shown in the figures, the interlayer dielectric layer 170 covers semiconductor devices formed on the semiconductor substrate.

A barrier metal layer 172 and a bottom interconnection conductive layer are formed to fill the interconnection groove 171 and are planarized by using a CMP process to form bottom interconnections 174a and 174b. The bottom interconnections are composed of a first bottom interconnection 174a and a second bottom interconnection 174b. The barrier metal layer 172 can be formed of at least one material selected from a group comprising Ta, TaN, TiN, WN, TaC, WC, TiSiN, and TaSiN, using PVD, CVD or ALD. The bottom interconnection conductive layer can be formed of a material selected from a group comprising aluminum (Al), aluminum-alloy, copper (Cu), gold (Au), silver (Ag), tungsten (W) and molybdenum (Mo), and with thickness of about 1,000~10,000 Å. The bottom interconnection conductive layer can be formed using sputtering, CVD or an electroplating method. In the case of using the sputtering method, a reflow process can be additionally carried out with the bottom interconnection conductive layer. In another case of using the electroplating method, a seed layer is formed on the barrier metal layer.

A first etch stopping layer 176, a bottom interlayer dielectric layer 178, and a second etch stopping layer 180 are formed at an entire surface of the semiconductor substrate having the bottom interconnections 174a and 174b.

The bottom interlayer dielectric layer 178 may be formed of a material selected from a group comprising $SiO_2$, SiOC, SiOH, and SiOCH, or of a low-k dielectric material whose dielectric constant is lower than 3.0. The bottom interlayer dielectric layer 178 can be formed using PECVD, HDP-CVD, APCVD, or spin coating.

The first etch stopping layer 176 and the second etch stopping layer 180 can be formed of silicon nitride, silicon carbide or silicon carbonitride using a PECVD method with a thickness of 100~1,000 Å.

Figure 8B:
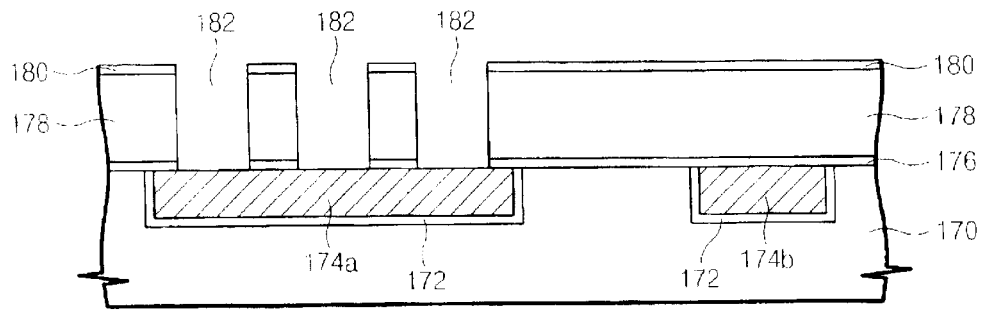

Referring to FIG. 8B, the second etch stopping layer 180, the bottom interlayer dielectric layer 178 and the first etch stopping layer 176 are selectively etched to form a plurality of openings 182 exposing the second bottom interconnection 174*a*. In FIG. 8B, there are three openings 182.

Figure 8C:
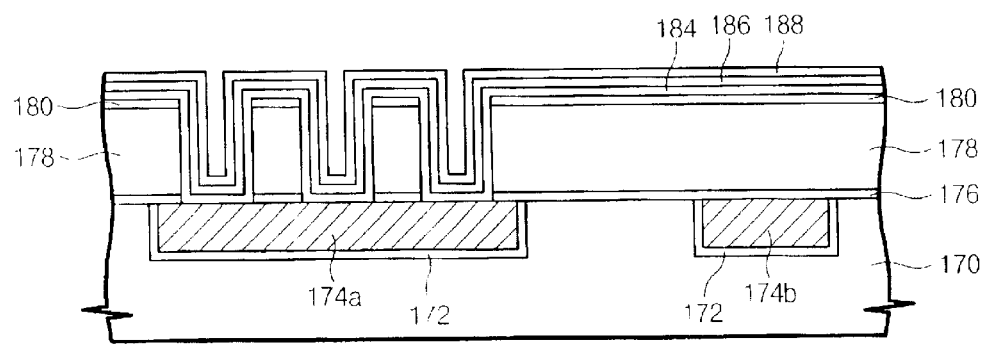

Referring to FIG. 8C, a bottom electrode conductive layer 184, a dielectric layer 186 and an upper electrode conductive layer 188 are formed at an entire surface of the semiconductor substrate having the openings 182. The bottom and upper electrode conductive layers 184 and 188 are formed of a material selected from a group comprising Ti, TiN, Ta, TaN, Pt, Ru, Ir, and W, and with a thickness of 300~5,000 Å.

The dielectric layer 186 can be formed of a material selected from a group comprising silicon oxide, silicon nitride, tantalum oxide, barium-strontium-titanium oxide, zirconium oxide, hafnium oxide, lead-zirconium-titanium oxide, and strontium-bismuth-tantalum oxide, using CVD, PCVD, or ALD, and with a thickness of 100~2,000 Å.

Figure 8D:
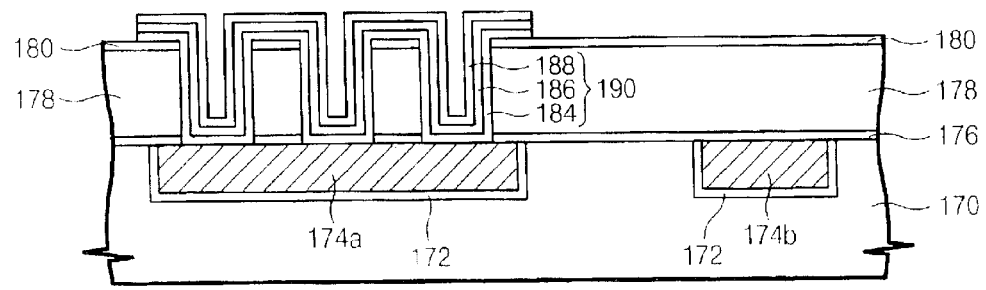

Referring to FIG. 8D, the upper electrode conductive layer 188, the dielectric layer 186, and the bottom electrode conductive layer 184 are selectively etched to form a capacitor pattern 190.

Because of a concave-convex structure along the inside wall of the openings 182, the exposed surface of the first bottom interconnection 174*a*, and the bottom interlayer dielectric layer 178, the capacitor pattern 190 has a wider effective surface area in comparison to the conventional technique. That is, by using the inside wall of the openings 182, the capacitance of the capacitor can be increased.

According to an aspect of the present invention, the capacitor pattern 190 can have a vertical structure by simultaneously dry-etching the upper electrode conductive layer 188, the dielectric layer 186, and the bottom electrode conductive layer 184. Because the capacitor pattern 190 is directly covered not by an upper interconnection but by an upper interlayer dielectric layer, in a subsequent process.

Figure 8E:
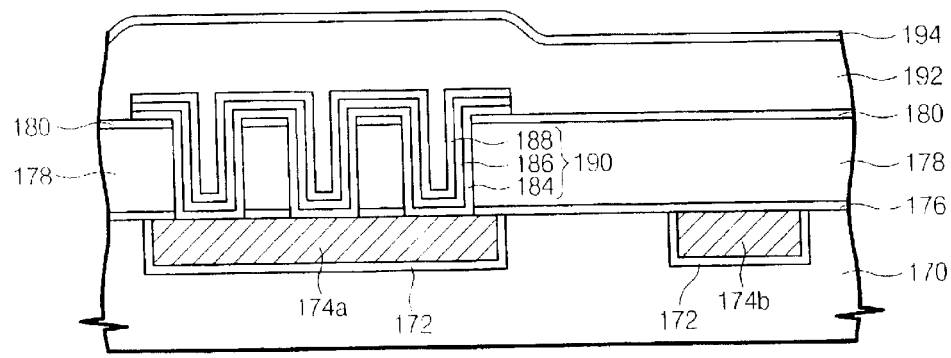

Referring to FIG. 8E, an upper interlayer dielectric layer 192 and a hard mask layer 194 are formed at an entire surface of the semiconductor substrate having the capacitor pattern 190.

Figure 8F:
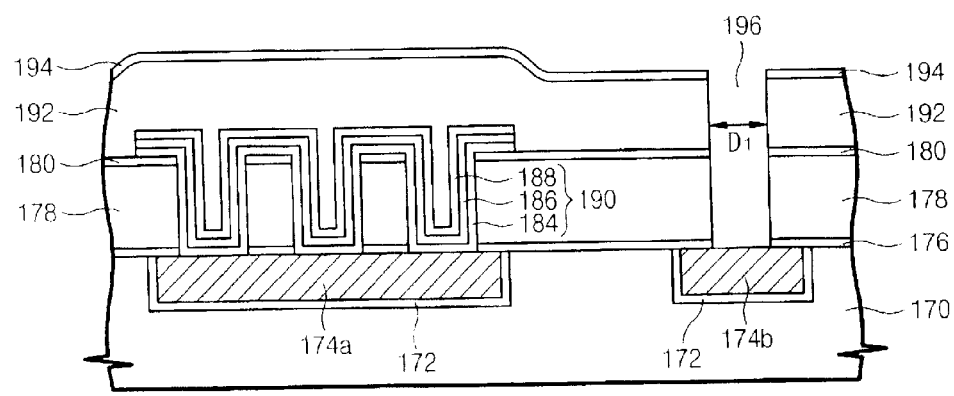

Referring to FIG. 8F, the hard mask layer 194, the upper interlayer dielectric layer 192, the second etch stopping layer 180, a bottom interlayer dielectric layer 178 and the first etch stopping layer 176 are selectively etched to form a via hole 196 having a width of D1.

Figure 8G:
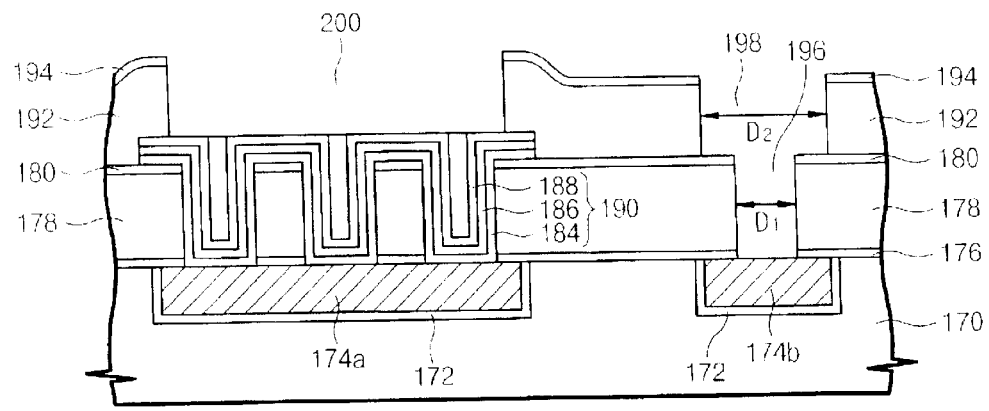

Referring to FIG. 8G, the hard mask layer 194 and the upper interlayer dielectric layer 192 are selectively etched to form an interconnection groove 198 having a width of D2, and simultaneously to form an opening 200 exposing the capacitor pattern 190.

Figure 8H:
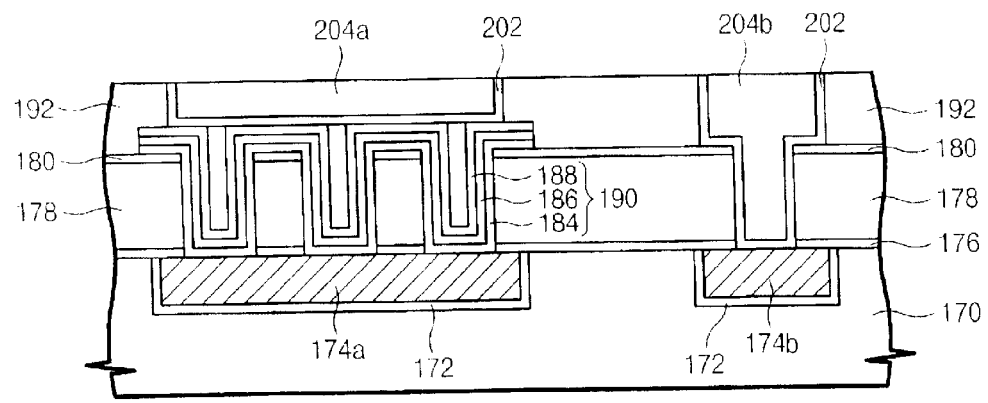

Referring to FIG. 8H, a barrier metal layer 202 and an upper interconnection conductive layer are formed to fill the via hole 196, the interconnection groove 198 and the opening 200, and are planarized using a CMP process to form a via plug and a second upper interconnection 204*b* and a first upper interconnection 204*a*.

Figure 8I:
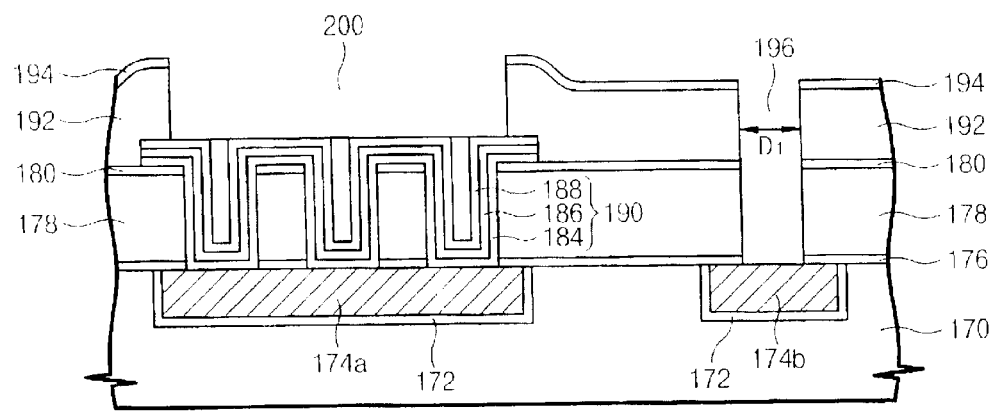

In the present embodiment, the interconnection groove 198 and the opening 200 exposing the capacitor are simultaneously formed. Alternatively, as illustrated in FIG. 8I, while forming the via hole 196, the opening 200 can be formed. And then, the interconnection groove 198 is formed as illustrated in FIG. 8G.

Embodiment 6.

In the present embodiment, an interconnection groove is formed first, and then a via hole is formed.

Figure 9A:
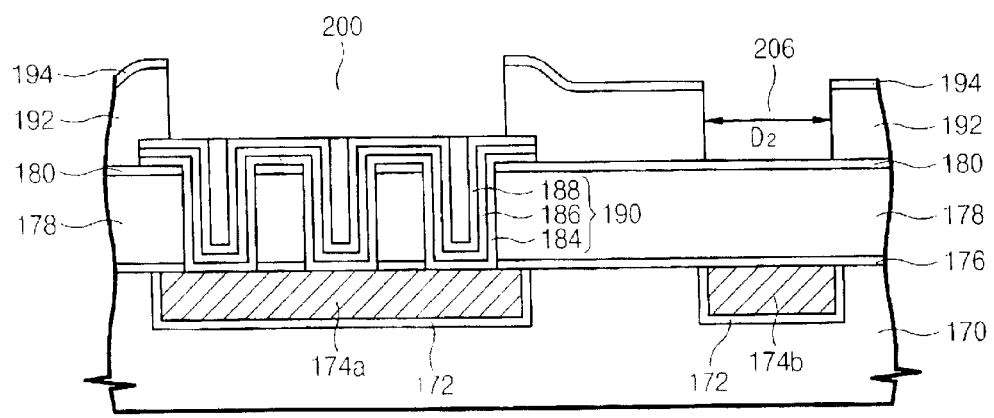
FIGS. 9A and 9B contain process cross-sectional views illustrating a method of forming a hole-type capacitor at a metal interconnection of two layers using a damascene process according to a sixth embodiment of the present invention.
Figure 9B:
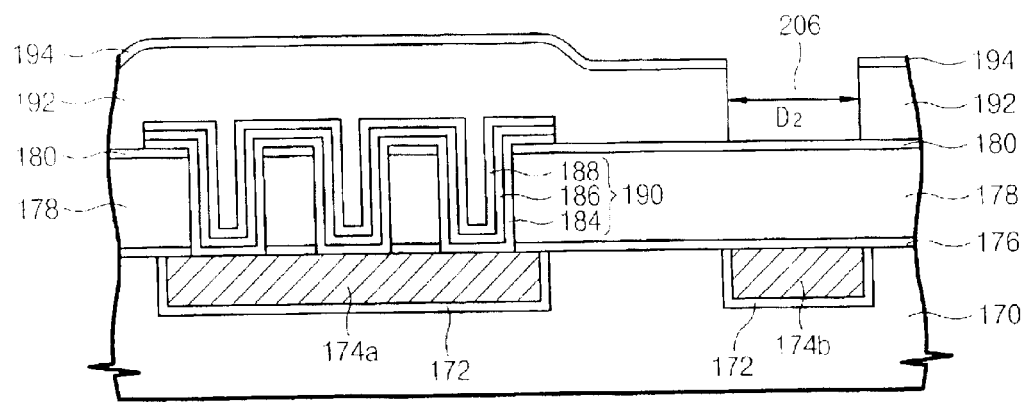

FIGS. 9A and 9B illustrate process cross-sectional views for showing a method of forming a hole-type capacitor at a metal interconnection of two layers using a damascene process according to a sixth embodiment of the present invention. Procedures of the present embodiment are identical with those of FIGS. 8A through 8E described in the fifth embodiment. Therefore the same reference numbers are used with respect to the same features of the fifth embodiment.

Referring to FIG. 9A, at the state of FIG. 8E, the hard mask layer 194 and the upper interlayer dielectric layer 192 are selectively etched to form an interconnection groove of a width D2 exposing the second etch stopping layer 180, and simultaneously to form an opening 200 exposing the capacitor pattern 190.

Next, referring again to FIG. 8G, the second etch stopping layer 180, the bottom interlayer dielectric layer 178 and the first etch stopping layer 176 are selectively etched to form a via hole of a width D1. The subsequent process steps are identical with those of the fifth embodiment.

In the embodiment described above, the opening 200 and the interconnection groove 198 are simultaneously formed. Alternatively, as illustrated in FIG. 9B, the interconnection groove 206 is formed first and then while forming the via hole 196, the opening 200 is formed to expose the capacitor as illustrated in FIG. 8G.

Embodiment 7.

FIGS. 10A through 10H illustrate process cross-sectional views for showing a method of forming a hole-type capacitor at a metal interconnection of three layers using a damascene process according to a seventh embodiment of the present invention.

In the present invention, a capacitor of an MIM structure can be formed through at least one intermetal dielectric layer. In the case that the capacitor is formed through a plurality of intermetal dielectric layers, capacitance of the capacitor is increased due to an increase of the height thereof.

Figure 10A:
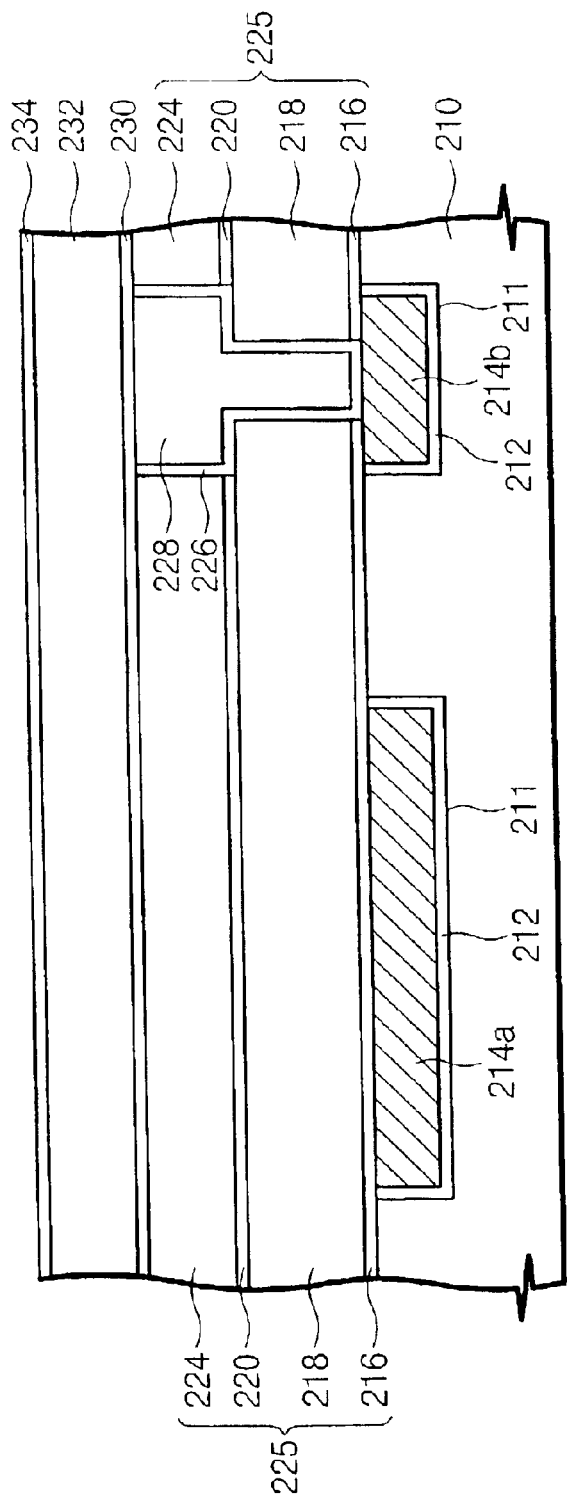

Referring to FIG. 10A, an interlayer dielectric layer 210 is formed at a semiconductor substrate and is selectively etched to form an interconnection groove 211. Although not shown in the figures, the interlayer dielectric layer 210 covers semiconductor devices formed on the semiconductor substrate.

A barrier metal layer 212 and a bottom interconnection conductive layer are formed to fill the interconnection groove 211, and are planarized by using a CMP process to form bottom interconnections 214*a* and 214*b*. The bottom interconnections are composed of a first bottom interconnection 214*a* and a second bottom interconnection 214*b*.

A first etch stopping layer 216, a bottom interlayer dielectric layer 218, a second etch stopping layer 220 and an upper interlayer dielectric layer 224 are sequentially stacked to compose middle insulation layers 225 for a middle interconnection. A conventional dual damascene process is performed with respect to the middle insulation layers 225 to form a damascene opening composed of a via hole and an interconnection groove. A barrier metal layer 226 and a conductive material are formed to fill the damascene opening and are planarized using a CMP process to simultaneously form a via plug and a middle interconnection 228.

A third etch stopping layer 230, an upper-bottom interlayer dielectric layer 232, and a fourth etch stopping layer 234 are sequentially stacked over an entire surface of the semiconductor substrate.

The bottom interconnections 214*a* and 214*b* and the middle interconnection 228 can be formed of a material selected from a group comprising aluminum (Al), aluminum-alloy, copper (Cu), gold (Au), silver (Ag), tungsten (W) and molybdenum (Mo), and with a thickness of about 1,000~10,000 Å. The bottom interconnections 214a and 214b and the middle interconnection 228 can be formed using sputtering, CVD or an electroplating method. In a case of using the sputtering method, a reflow process can be additionally carried out. In another case of using the electroplating method, a seed layer is formed on the barrier metal layers 212 and 226.

The barrier metal layers 212 and 226 can be formed of at least one material selected from a group comprising Ta, TaN, TiN, WN, TaC, WC, TiSiN, and TaSiN, using PVD, CVD or ALD.

The interlayer dielectric layers 218, 224 and 232 may be formed of a material selected from a group comprising $SiO_2$, SiOC, SiOH, and SiOCH, or of a low-k dielectric material whose dielectric constant is lower than 3.0. The interlayer dielectric layers 218, 224 and 232 can be formed by PECVD, HDP-CVD, APCVD, or spin coating.

The etch stopping layers 216, 220, 230 and 234 can be formed of silicon nitride, silicon carbide or silicon carbonitride using a PECVD method with a thickness of 100~1,000 Å.

Figure 10B:
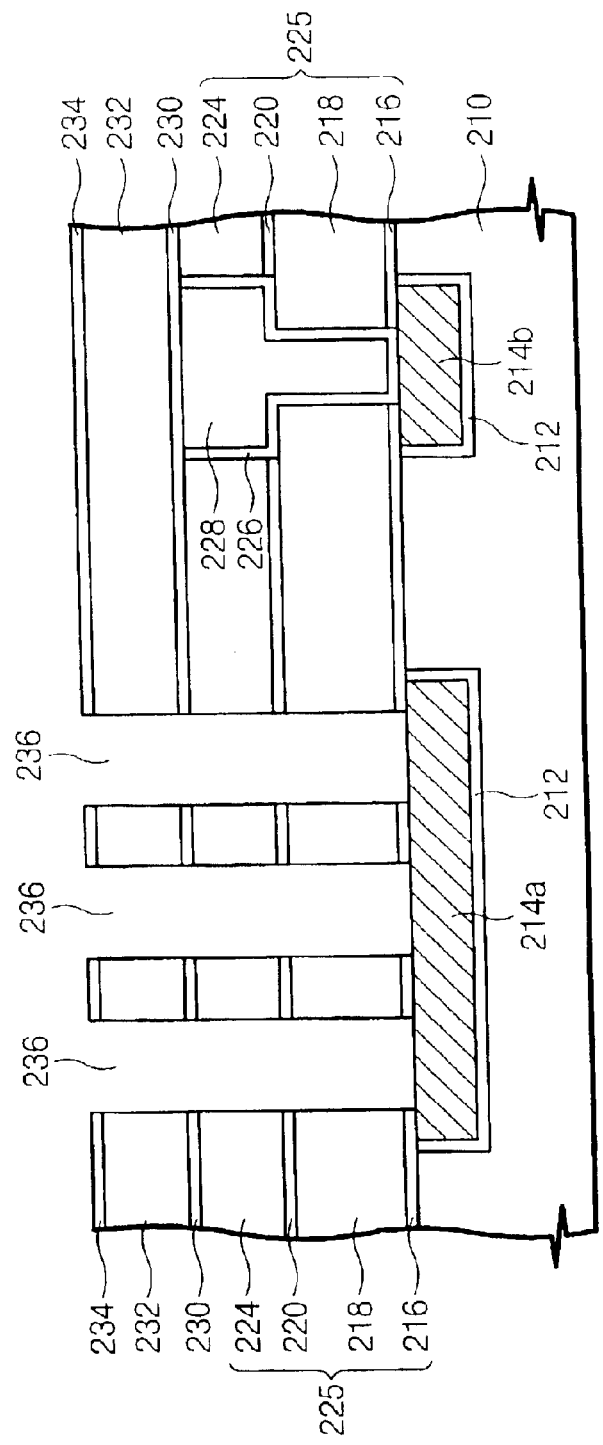

Referring to FIG. 10B, the fourth etch stopping layer 234, the upper-bottom interlayer dielectric layer 232, the third etch stopping layer 230 and the middle insulation layers 225 are selectively etched to form a plurality of openings 236 exposing the first bottom interconnection 214a. In FIG. 10B, there are three openings 236.

Figure 10C:
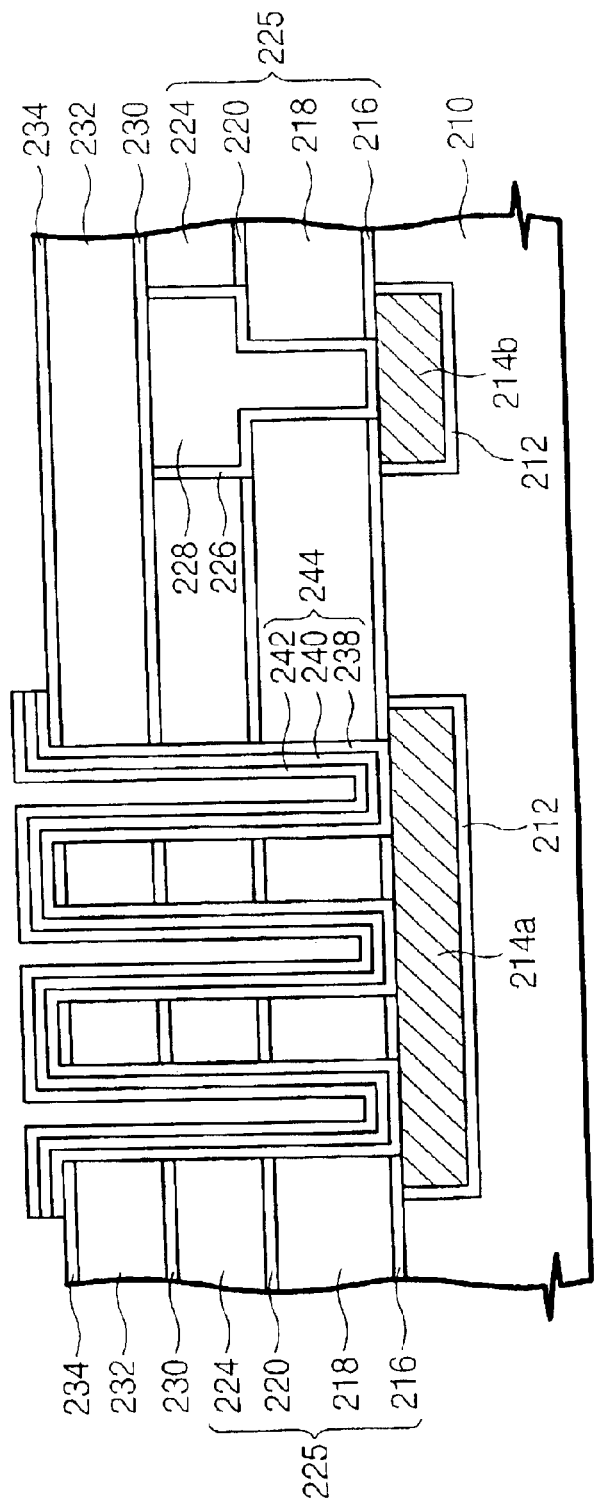

Referring to FIG. 10C, a bottom electrode conductive layer 238, a dielectric layer 240 and an upper electrode conductive layer 242 are formed at an entire surface of the semiconductor substrate having the openings 236, and are patterned to form a capacitor pattern 244. Because of a concave-convex structure formed along the inside wall of the openings 236, the exposed surface of the first bottom interconnection 214a, and the interlayer dielectric layers 218, 224 and 232, the capacitor pattern 244 has a wider effective surface area in comparison to the conventional technique. That is, by using the inside wall of the openings 236, the capacitance of the capacitor can be increased.

The capacitor pattern 244 can have a vertical structure by simultaneously dry-etching the upper electrode conductive layer 242, the dielectric layer 240, and the bottom electrode conductive layer 238.

The bottom and upper electrode conductive layers 238 and 242 are formed of a material selected from a group comprising Ti, TiN, Ta, TaN, Pt, Ru, Ir, and W, and with a thickness of 300~5,000 Å.

The dielectric layer 240 can be formed of a material selected from a group comprising silicon oxide, silicon nitride, tantalum oxide, barium-strontium-titanium oxide, zirconium oxide, hafnium oxide, lead-zirconium-titanium oxide, and strontium-bismuth-tantalum oxide, using CVD, PCVD, or ALD, and with a thickness of 100~2,000 Å.

Figure 10D:
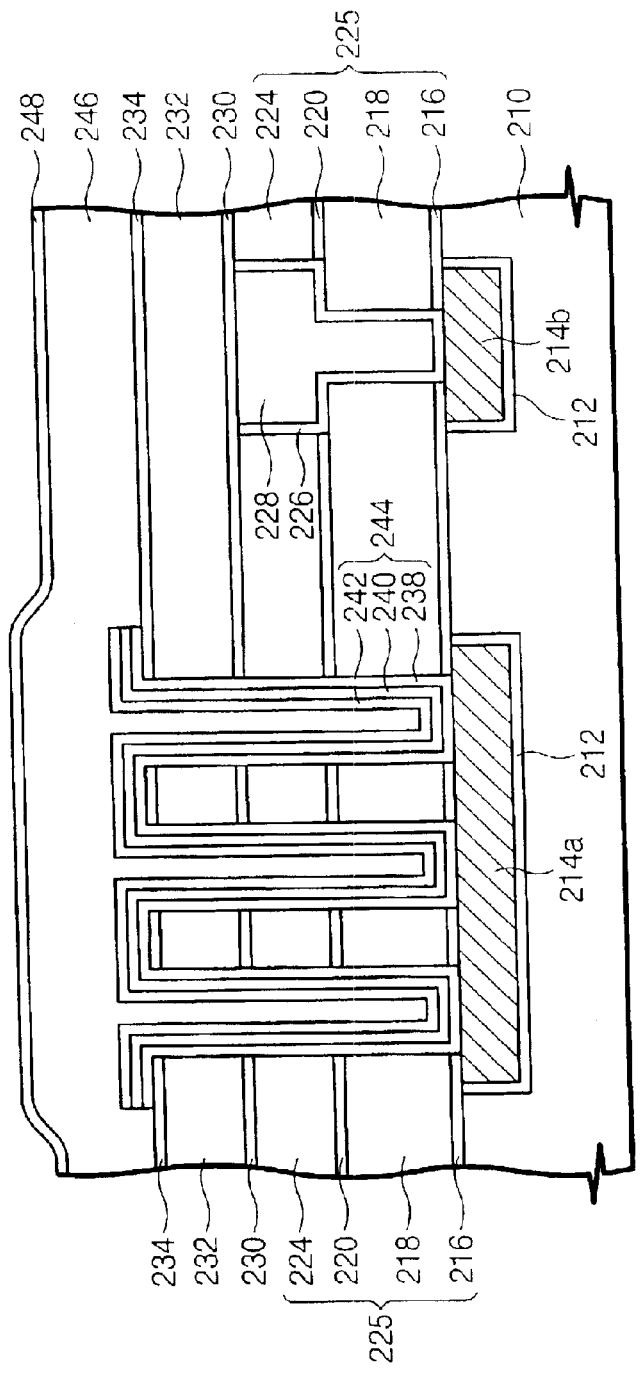

Referring to FIG. 10D, another upper interlayer dielectric layer 246, and a hard mask layer 248 are formed at an entire surface of the semiconductor substrate having the capacitor pattern 244.

Figure 10E:
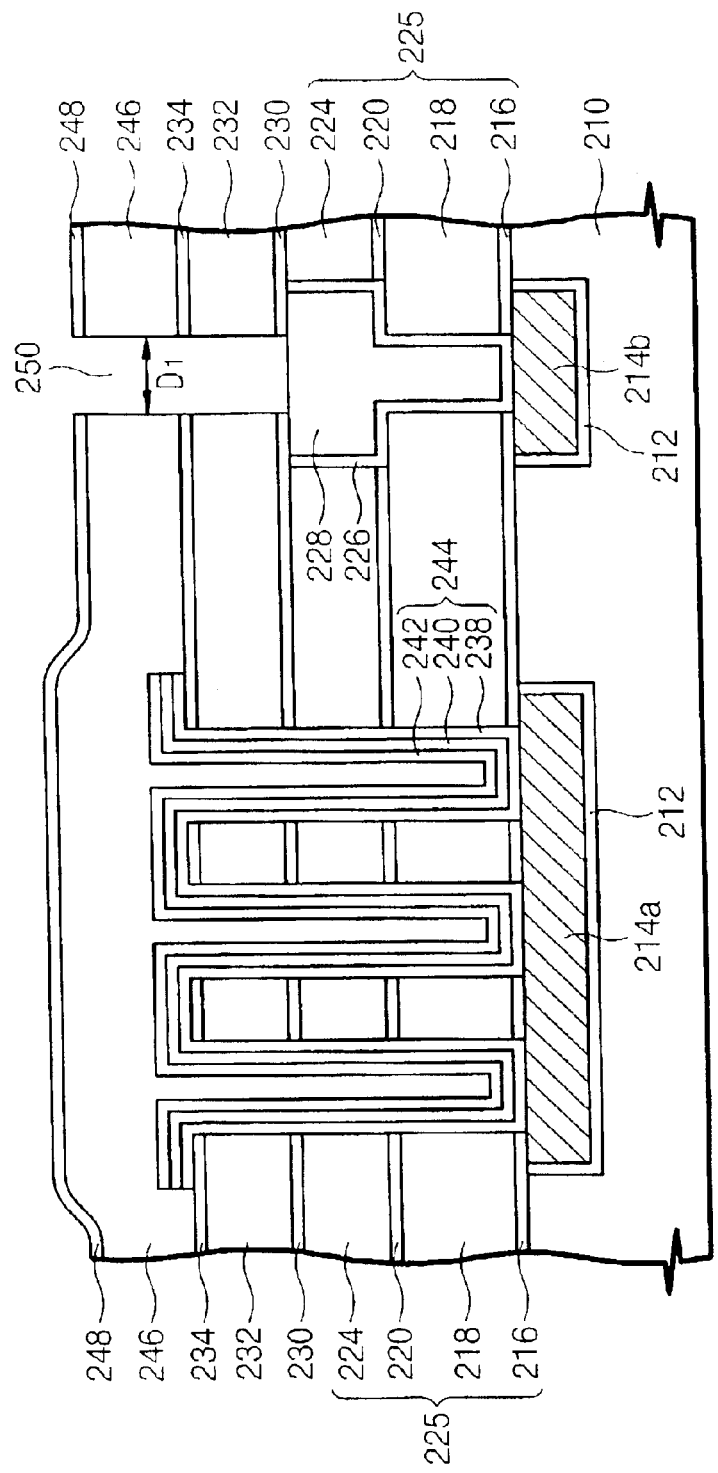

Referring to FIG. 10E, the hard mask layer 248, the other upper interlayer dielectric layer 246, the fourth etch stopping layer 234, the upper-bottom interlayer dielectric layer 232 and the third etch stopping layer 230 are selectively etched to form a via hole of a width D1.

Figure 10F:
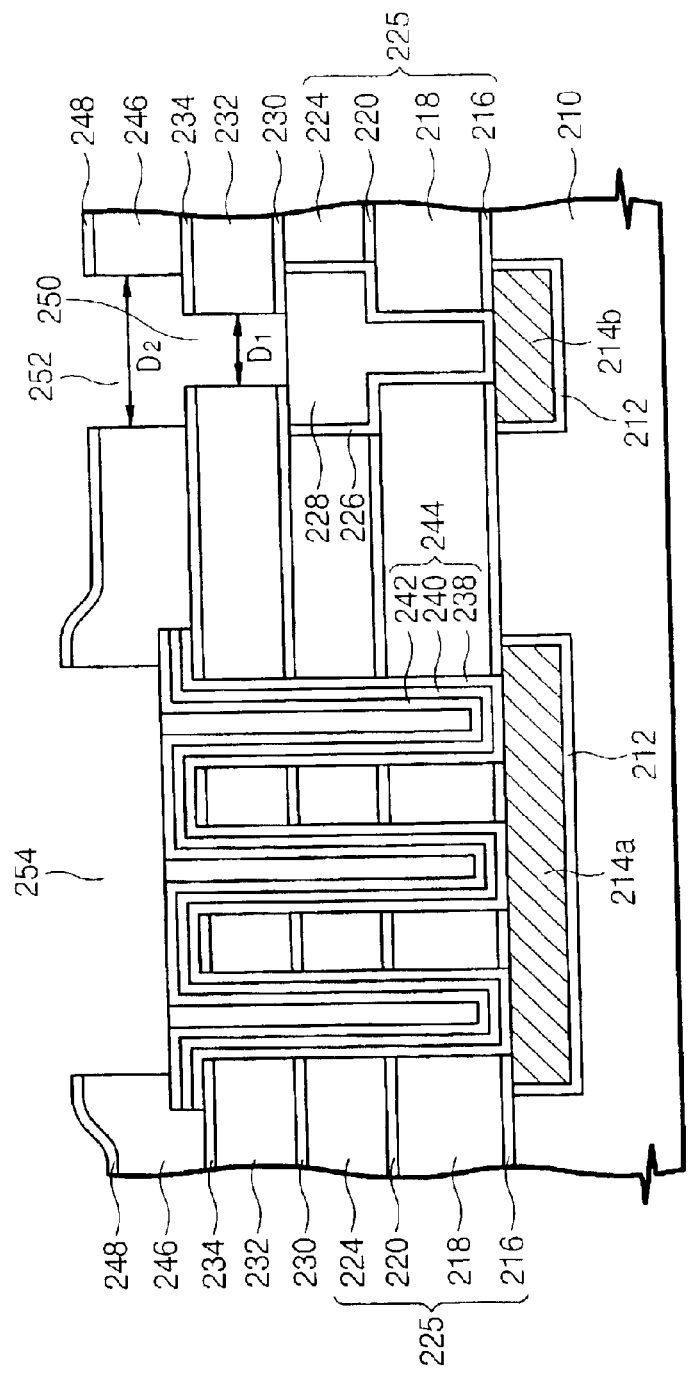

Referring to FIG. 10F, the hard mask layer 248 and the other upper interlayer dielectric layer 246 are selectively etched using photoresist to form an interconnection groove 252 of a width D2, and simultaneously to form an opening 254 exposing the capacitor pattern 244.

Referring to FIG. 10G, a barrier metal layer 256 and an upper interconnection conductive layer are formed to fill the via hole 250, the interconnection groove 252 and the opening 254, and are plananrized using a CMP process to form a first upper interconnection 258a, a via plug and a second upper interconnection 258b.

Figure 10H:
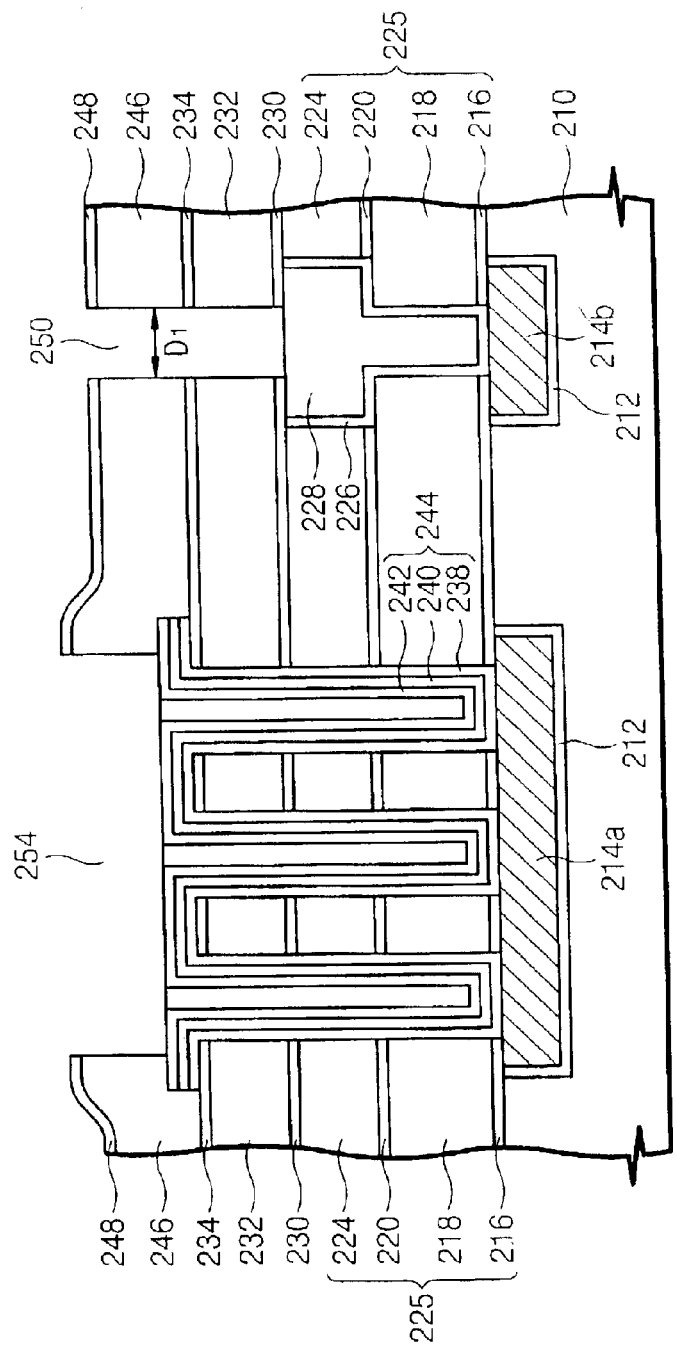

In the present embodiment, the interconnection groove 252 and the opening 254 exposing the capacitor pattern 244 are simultaneously formed. Alternatively, as illustrated in FIG. 10H, while forming the via hole 250, the opening 254 can be formed. And then, the interconnection groove 252 is formed as illustrated in FIG. 10F.

Embodiment 8.

In the present embodiment, an interconnection groove is formed first, and then a via hole is formed.

Figure 11B:
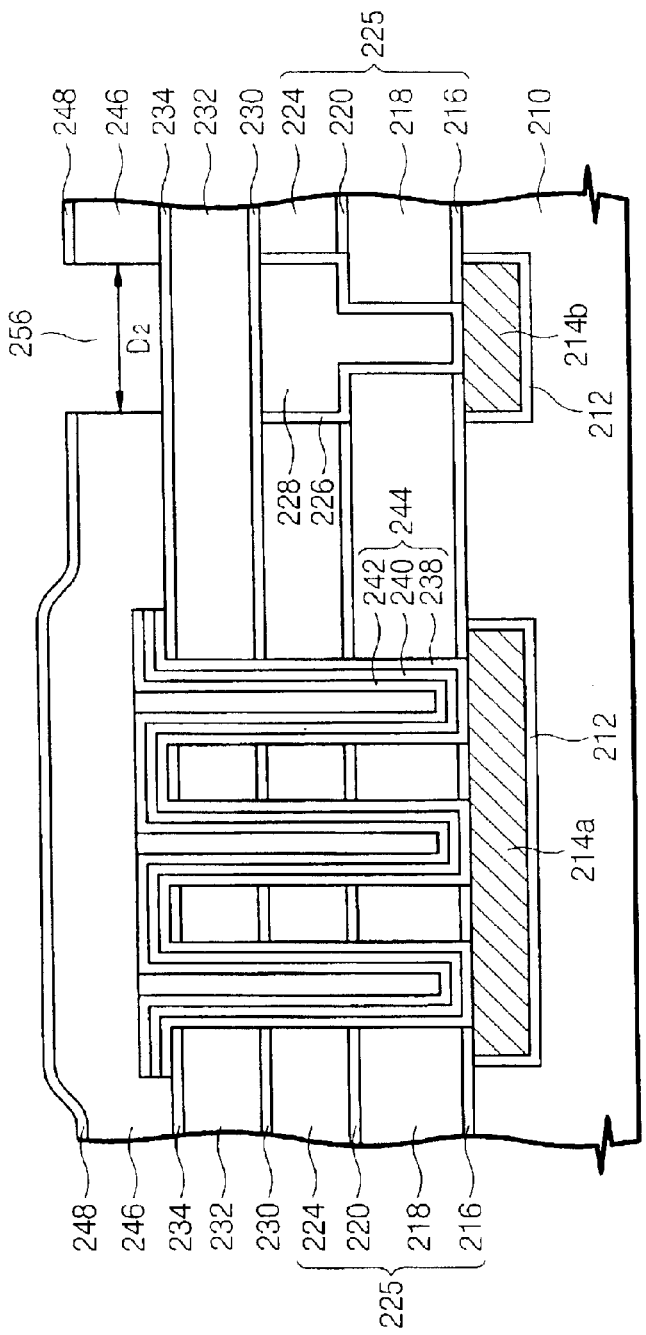

FIGS. 11A through 11B illustrate process cross-sectional views for showing a method of forming a hole-type capacitor at a metal interconnection of three layers by using a damascene process according to an eighth embodiment of the present invention. Procedures of the present embodiment are identical with those of FIGS. 10A through 10D described in the seventh embodiment. Therefore the same reference numbers are used with respect to the same features as the seventh embodiment.

Referring to FIG. 11A, at the state of FIG. 10D, the hard mask layer 248 and the other upper interlayer dielectric layer 246 are selectively etched to form an interconnection groove 256 of a width D2 exposing the fourth etch stopping layer 234, and simultaneously to form an opening 254 exposing the capacitor pattern 244.

Next, referring again to FIG. 10F, the fourth etch stopping layer 234, the upper-bottom interlayer dielectric layer 232 and the third etch stopping layer 230 are selectively etched to form a via hole 250 of a width D1. The subsequent procedures are identical with the seventh embodiment.

In the embodiment described above, the opening 254 and the interconnection groove 256 are simultaneously formed. Alternatively, as illustrated in FIG. 11B, the interconnection groove 256 is formed first, and then, while forming the via hole 250, the opening 254 is formed to expose the capacitor pattern 244 as illustrated in FIG. 10F.

According to the present invention described above, an effective surface area of a capacitor per is increased to enlarge capacitor capacitance in comparison with a conventional MIM capacitor.

Additional advantages and modifications will readily occur to those of ordinary skill in the art. Therefore, the present invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a semiconductor substrate;
   a first bottom interconnection formed over the semiconductor substrate;
   an intermetal dielectric layer formed over the semiconductor substrate where the first bottom interconnection is formed;
   a plurality of openings exposing the first bottom interconnection through the intermetal dielectric layer;
   a bottom electrode conformally formed on the inside wall of the openings, on the exposed surface of the first bottom interconnection and on the top surface of the intermetal dielectric layer between the openings;

a dielectric layer and an upper electrode which are sequentially stacked on the bottom electrode; and a first upper interconnection disposed on the upper electrode, wherein the first upper interconnection is electrically connected to the upper electrode.

2. The semiconductor device as claimed in claim 1, wherein the opening has a hole-type shape in plan view.

3. The semiconductor device as claimed in claim 1, wherein the opening has a stripe-type shape in plan view.

4. The semiconductor device as claimed in claim 1, wherein the opening has a mesh-type shape in plan view.

5. The semiconductor device as claimed in claim 1, further comprising:

a second bottom interconnection formed on the semiconductor substrate adjacent to the first interconnection; and a second upper interconnection formed on the intermetal dielectric layer adjacent to the first upper interconnection, wherein the second upper interconnection is electrically connected to the second bottom interconnection through a via hole penetrating the intermetal dielectric layer.

6. The semiconductor device as claimed in claim 5, further comprising a via contact plug formed in the via hole, wherein the second upper interconnection is electrically connected to the second bottom interconnection through the via contact plug.

7. The semiconductor device as claimed in claim 1, wherein the first bottom interconnection and the first upper interconnection are fanned of at least one material selected from a group consisting of aluminum (Al), aluminum-alloy, copper (Cu), gold (Au), silver (Ag), tungsten (W) and molybdenum (Mo).

8. The semiconductor device as claimed in claim 1, wherein the intermetal dielectric layer is formed of at least one material selected from a group consisting of $SiO_2$, SIOC, SiOH, and SiOCH, and a low-k dielectric material.

9. The semiconductor device as claimed in claim 1, wherein the bottom electrode and the upper electrode are formed of at least one material selected from a group consisting of Ti, TiN, Ta, TaN, Pt, Ru, Ir, and W.

10. The semiconductor device as claimed in claim 1, wherein the dielectric layer is formed of at least one material selected from a group consisting of silicon oxide, silicon nitride, tantalum oxide, barium-strontium-titanium oxide, zirconium oxide, hafnium oxide, lead-zirconium-titanium oxide, and strontium-bismuth-tantalum oxide.

11. The semiconductor device as claimed in claim 1, wherein the intermetal dielectric layer is composed of a plurality of interlayer dielectric layers which are sequentially stacked.

12. The semiconductor device as claimed in claim 11, further comprising:

a second bottom interconnection formed on the semiconductor substrate adjacent to the first bottom interconnection; and a second upper interconnection formed on the plurality of interlayer dielectric layers adjacent to the second bottom interconnection, wherein the second upper interconnection is electrically connected to the second bottom interconnection.

13. The semiconductor device as claimed in claim 12, further comprising at least one middle interconnection interposed between the plurality of interlayer dielectric layers, wherein the second upper interconnection is electrically connected to the second bottom interconnection through the middle interconnection.

14. The semiconductor device as claimed in claim 1, further comprising:

an interlayer dielectric layer interposed between the first bottom interconnection and the semiconductor substrate; and an upper interlayer dielectric layer formed on the intermetal dielectric layer.

15. The semiconductor device as claimed in claim 14, wherein the first bottom interconnection is disposed in the interlayer dielectric layer, a top surface of the first bottom interconnection having the same height as that of the interlayer dielectric layer.

16. The semiconductor device as claimed in claim 14, wherein the first upper interconnection is disposed in the upper interlayer dielectric layer, wherein a top surface of the first interconnection has the same height as that of the upper interlayer dielectric layer.

17. A method of forming a semiconductor device, comprising:

forming a first bottom interconnection on a semiconductor substrate;

forming an intermetal dielectric layer on the first bottom interconnection, forming a plurality of openings exposing the first bottom interconnection through the intermetal dielectric layer;

conformally and sequentially forming a bottom electrode conductive layer, a dielectric layer and an upper electrode conductive layer on the inside wall of the openings, the exposed first bottom interconnection and on the top surface of the intermetal dielectric layer between the openings;

patterning the bottom electrode conductive layer, the dielectric layer and the upper electrode conductive layer to form a capacitor pattern; and forming a first upper interconnection on the capacitor pattern.

18. A method of forming a semiconductor device, comprising:

forming an interlayer dielectric layer on a semiconductor substrate;

forming a first bottom interconnection in the interlayer dielectric layer, the first bottom interconnection having the same height as a top surface of the interlayer dielectric layer;

forming an intermetal dielectric layer on the first bottom interconnection;

forming a plurality of first openings exposing the first bottom interconnection through the intermetal dielectric layer;

conformally and sequentially forming a bottom electrode conductive layer, a dielectric layer and an upper electrode conductive layer on the inside wall of the first openings, the exposed first bottom interconnection and on the top surface of the intermetal dielectric layer between the openings;

patterning the bottom electrode conductive layer, the dielectric layer and the upper electrode conductive layer to form a capacitor pattern;

forming an upper interlayer dielectric layer at an entire surface of the semiconductor substrate having the capacitor pattern;

forming a second opening in the upper interlayer dielectric layer to expose the capacitor pattern; and filling with a conductive material the opening exposing the capacitor pattern to form a first upper interconnection.

* * * * *

UNITED STATES PATENT AND TRADEMARK OFFICE
CERTIFICATE OF CORRECTION

PATENT NO. : 6,765,255 B2 Page 1 of 1
DATED : July 20, 2004
INVENTOR(S) : You-Seung Jin et al.

It is certified that error appears in the above-identified patent and that said Letters Patent is hereby corrected as shown below:

Column 15,
Line 31, delete "fanned" and insert -- formed --.
Line 38, delete "SIOC" and insert -- SiOC --.

Signed and Sealed this

Thirtieth Day of November, 2004

JON W. DUDAS
*Director of the United States Patent and Trademark Office*